US012588196B2

(12) United States Patent
Lee et al.

(10) Patent No.: US 12,588,196 B2
(45) Date of Patent: Mar. 24, 2026

(54) ELECTRODE STRUCTURE INCLUDING NANO DOT PATTERN AND SEMICONDUCTOR DEVICE AND ELECTRONIC SYSTEM INCLUDING THE SAME

(71) Applicant: SAMSUNG ELECTRONICS CO., LTD., Suwon-si (KR)

(72) Inventors: Keun Lee, Seongnam-si (KR); Kihyun Yoon, Suwon-si (KR); Jeonggil Lee, Hwaseong-si (KR); Hauk Han, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 610 days.

(21) Appl. No.: 17/888,647

(22) Filed: Aug. 16, 2022

(65) Prior Publication Data

US 2023/0135639 A1 May 4, 2023

(30) Foreign Application Priority Data

Oct. 28, 2021 (KR) ........................ 10-2021-0145733

(51) Int. Cl.
*H10B 41/27* (2023.01)
*H10D 30/68* (2025.01)

(52) U.S. Cl.
CPC ......... *H10B 41/27* (2023.02); *H10D 30/6893* (2025.01)

(58) Field of Classification Search
CPC ........ H10B 41/27; H10B 43/40; H10B 43/50; H10B 43/27; H10B 43/35; H10D 30/6893;

(Continued)

(56) References Cited

U.S. PATENT DOCUMENTS 7,544,990 B2    6/2009    Bhattacharyya
9,029,936 B2    5/2015    Purayath et al.
(Continued)

FOREIGN PATENT DOCUMENTS

KR        20070053071 A      5/2007
KR      10-2008-0050654 A    6/2008
(Continued)

OTHER PUBLICATIONS

Sugiyama et al., "Characteristics of spectral-hole burning of InAs self-assembled quantum dots," in IEEE Journal of Selected Topics in Quantum Electronics, vol. 4, No. 5, pp. 880-885, Sep.-Oct. 1998, doi: 10.1109/2944.735774 (Year: 1998).*

*Primary Examiner* — William B Partridge
*Assistant Examiner* — Ilker Nmn Ozden
(74) *Attorney, Agent, or Firm* — Muir Patent Law, PLLC

(57) ABSTRACT

An electrode structure includes a conductive electrode, the conductive electrode including a first surface, an insulating layer on the conductive electrode, the insulating layer being in contact with the first surface of the conductive electrode, and a nano dot pattern in the conductive electrode and spaced apart from the first surface of the conductive electrode, the nano dot pattern including nano dots arranged in parallel to the first surface of the conductive electrode, and each of the nano dots including a first side surface adjacent to the first surface of the conductive electrode, the first side surface being flat and parallel to the first surface of the conductive electrode, and a second side surface opposite to the first side surface, the second side surface being convex in a direction away from the first surface of the conductive electrode.

19 Claims, 35 Drawing Sheets

(58) Field of Classification Search
CPC ............. H10D 30/6891; H10D 30/694; H10D 64/514; H10D 64/517; H10D 64/519; H10D 64/205; H10D 64/665; H10D 30/689
See application file for complete search history.

(56) References Cited

U.S. PATENT DOCUMENTS

| | | | |
|---|---|---|---|
| 9,177,808 B2 | 11/2015 | Purayath et al. | |
| 9,331,181 B2 | 5/2016 | Lee et al. | |
| 10,818,760 B2 | 10/2020 | Ramaswamy et al. | |
| 2004/0099858 A1* | 5/2004 | Lee ......................... | B82Y 20/00 |
| | | | 257/13 |
| 2005/0067615 A1* | 3/2005 | Yoshii .................. | H10D 62/136 |
| | | | 257/E29.189 |
| 2007/0247904 A1 | 10/2007 | Duan et al. | |
| 2008/0169501 A1* | 7/2008 | Yang .................. | H10D 30/6893 |
| | | | 257/E21.294 |
| 2010/0038698 A1* | 2/2010 | Lee ........................ | H10B 43/30 |
| | | | 977/773 |
| 2015/0236029 A1* | 8/2015 | Afzali-Ardakani .......................... | |
| | | | H10D 64/667 |
| | | | 977/840 |
| 2017/0338242 A1* | 11/2017 | Hwang .................. | H10B 43/35 |
| 2019/0245001 A1* | 8/2019 | Park ...................... | H10F 77/146 |
| 2020/0388680 A1 | 12/2020 | Lee et al. | |
| 2022/0238672 A1* | 7/2022 | Lee ...................... | H10D 64/037 |

FOREIGN PATENT DOCUMENTS

| | | |
|---|---|---|
| KR | 10-0843229 B1 | 7/2008 |
| KR | 20130037062 A | 4/2013 |
| KR | 10-2017-0130009 A | 11/2017 |

* cited by examiner

CS
PS
ILD3
ILD2
LIL
DIL

PER
CNR
CAR

STS

PCNT

VP SP VI
VS
VEP2
VEP1 EXP
VS

PAD
CH CH1
CH2

DIL

ILD5
ILD4
IL4
IL3
HL2
IL3
HL2
IL2
HL1
IL1
HL1
IL1
USL
IL6
LHL
IL5
LSL
ILD1
PTR
SUB

ELECTRODE STRUCTURE INCLUDING NANO DOT PATTERN AND SEMICONDUCTOR DEVICE AND ELECTRONIC SYSTEM INCLUDING THE SAME

CROSS-REFERENCE TO RELATED APPLICATION

This U.S. non-provisional patent application claims priority under 35 U.S.C. § 119 to Korean Patent Application No. 10-2021-0145733, filed on Oct. 28, 2021, in the Korean Intellectual Property Office, the entire contents of which are hereby incorporated by reference.

BACKGROUND

1. Field

The present disclosure relates to a three-dimensional semiconductor memory device and an electronic system including the same.

2. Description of the Related Art

A semiconductor device capable of storing a large amount of data is required as a data storage of an electronic system. Accordingly, many studies are being conducted to increase the data storage capacity of the semiconductor device. For example, semiconductor devices, in which memory cells are three-dimensionally arranged, are being suggested.

SUMMARY

According to an embodiment, an electrode structure may include a conductive electrode, the conductive electrode including a first surface, an insulating layer on the conductive electrode, the insulating layer being in contact with the first surface of the conductive electrode, and a nano dot pattern in the conductive electrode and spaced apart from the first surface of the conductive electrode, the nano dot pattern including nano dots arranged in parallel to the first surface of the conductive electrode, and each of the nano dots including a first side surface adjacent to the first surface of the conductive electrode, the first side surface being flat and parallel to the first surface of the conductive electrode, and a second side surface opposite to the first side surface, the second side surface being convex in a direction away from the first surface of the conductive electrode.

According to another embodiment, a semiconductor device may include a substrate, a cell array structure on the substrate, the cell array structure including a plurality of electrodes and a plurality of insulating layers which are alternately stacked, a vertical channel structure penetrating the plurality of electrodes, and a nano dot pattern in a first electrode of the plurality of electrodes, the nano dot pattern including a first pattern parallel to a bottom surface of the first electrode, a second pattern parallel to a side surface of the first electrode, and a third pattern parallel to a top surface of the first electrode, and each of the first pattern, the second pattern, and the third pattern including nano dots, wherein the side surface of the first electrode is parallel to a side surface of the vertical channel structure, wherein the nano dots of the first pattern are spaced apart from the bottom surface of the first electrode and are arranged parallel to the bottom surface of the first electrode, wherein the nano dots of the second pattern are spaced apart from the side surface of the first electrode and are arranged parallel to the side surface of the first electrode, and wherein the nano dots of the third pattern are spaced apart from the top surface of the first electrode and are arranged parallel to the top surface of the first electrode.

According to yet another embodiment, an electronic system may include a three-dimensional semiconductor memory device, and a controller electrically connected to the three-dimensional semiconductor memory device, the controller being configured to control the three-dimensional semiconductor memory device, wherein the three-dimensional semiconductor memory device includes a substrate, a cell array structure on the substrate, the cell array structure including a plurality of electrodes and a plurality of insulating layers which are alternately stacked, a vertical channel structure penetrating the plurality of electrodes, and a nano dot pattern in a first electrode of the plurality of electrodes, the nano dot pattern including a first pattern parallel to a bottom surface of the first electrode, a second pattern parallel to a side surface of the first electrode, and a third pattern parallel to a top surface of the first electrode, and each of the first pattern, the second pattern, and the third pattern including nano dots, wherein the side surface of the first electrode is parallel to a side surface of the vertical channel structure, wherein the nano dots of the first pattern are spaced apart from the bottom surface of the first electrode and are arranged parallel to the bottom surface of the first electrode, wherein the nano dots of the second pattern are spaced apart from the side surface of the first electrode and are arranged parallel to the side surface of the first electrode, and wherein the nano dots of the third pattern are spaced apart from the top surface of the first electrode and are arranged parallel to the top surface of the first electrode.

BRIEF DESCRIPTION OF THE DRAWINGS

Features will become apparent to those of skill in the art by describing in detail exemplary embodiments with reference to the attached drawings, in which:

FIGS. 3 and 4 are sectional views, each of which schematically illustrates a semiconductor package according to an embodiment.

FIG. 5 is a plan view illustrating a semiconductor device according to an embodiment.

FIG. 7 is an enlarged sectional view illustrating a portion 'A' of FIG. 6A.

FIGS. 10A, 11A, 12A, 13A, 14A, 15A, 16A, and 17A are sectional views along line I-I' of FIG. 5 of stages in a method of fabricating a semiconductor device according to an embodiment.

FIG. 22 is a diagram illustrating a semiconductor device according to an embodiment.

FIGS. 23 to 26 are diagrams illustrating stages in a method of fabricating a semiconductor device according to an embodiment and corresponding to FIGS. 18 to 21.

DETAILED DESCRIPTION

Figure 1:
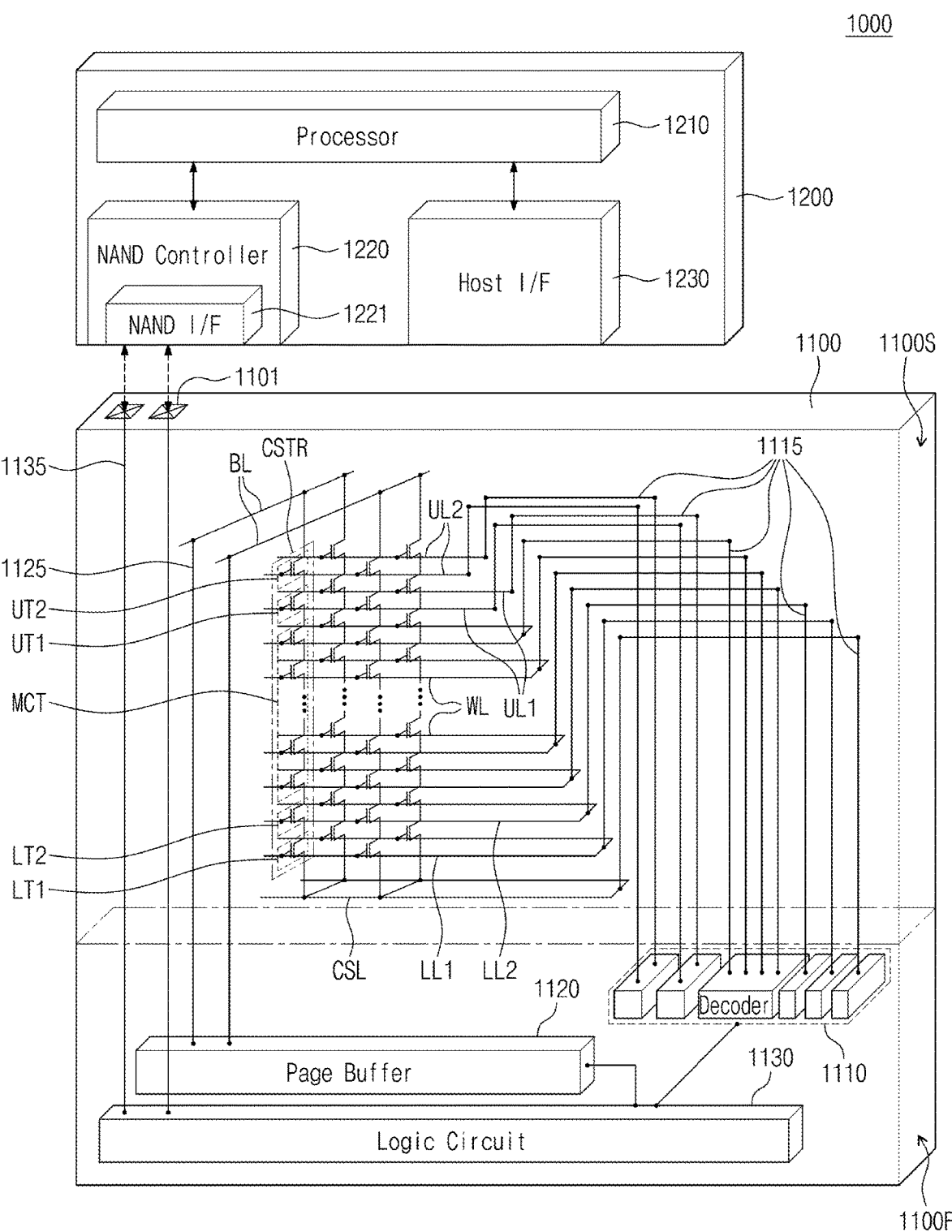
FIG. 1 is a diagram schematically illustrating an electronic system including a semiconductor device according to an embodiment.

FIG. 1 is a diagram schematically illustrating an electronic system including a semiconductor device according to an embodiment.

Referring to FIG. 1, an electronic system 1000 according to an embodiment may include a semiconductor device 1100 and a controller 1200 electrically connected to the semiconductor device 1100. The electronic system 1000 may be a storage device including one or more semiconductor devices 1100 or an electronic device including the storage device. For example, the electronic system 1000 may be a solid state drive (SSD) device, a universal serial bus (USB), a computing system, a medical system, or a communication system, in which at least one semiconductor device 1100 is provided.

The semiconductor device 1100 may be a nonvolatile memory device (e.g., a NAND FLASH memory device). The semiconductor device 1100 may include a first structure 1100F and a second structure 1100S on the first structure 1100F. In an embodiment, the first structure 1100F may be disposed beside the second structure 1100S. The first structure 1100F may be a peripheral circuit structure including a decoder circuit 1110, a page buffer 1120, and a logic circuit 1130. The second structure 1100S may be a memory cell structure including a bit line BL, a common source line CSL, word lines WL, first and second gate upper lines UL1 and UL2, first and second gate lower lines LL1 and LL2, and memory cell strings CSTR between the bit line BL and the common source line CSL.

In the second structure 1100S, the memory cell strings CSTR may be arranged to form a three-dimensional memory cell structure. Each of the memory cell strings CSTR may be extended vertically. Each of the memory cell strings CSTR may include lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. The number of the lower transistors LT1 and LT2 and the number of the upper transistors UT1 and UT2 may be variously changed, according to embodiments.

In an embodiment, the upper transistors UT1 and UT2 may include at least one string selection transistor, and the lower transistors LT1 and LT2 may include at least one ground selection transistor. The gate lower lines LL1 and LL2 may be respectively used as gate electrodes of the lower transistors LT1 and LT2. The word lines WL may be respectively used as gate electrodes of the memory cell transistors MCT, and the gate upper lines UL1 and UL2 may be respectively used as gate electrodes of the upper transistors UT1 and UT2.

In an embodiment, the lower transistors LT1 and LT2 may include a lower erase control transistor LT1 and a ground selection transistor LT2, which are connected in series. The upper transistors UT1 and UT2 may include a string selection transistor UT1 and an upper erase control transistor UT2, which are connected in series. At least one of the lower and upper erase control transistors LT1 and UT2 may be used for an erase operation of erasing data, which are stored in the memory cell transistors MCT, using a gate-induced drain leakage (GIDL) phenomenon.

The common source line CSL, the first and second gate lower lines LL1 and LL2, the word lines WL, and the first and second gate upper lines UL1 and UL2 may be electrically connected to the decoder circuit 1110 through first connection lines 1115, which are extended from the first structure 1100F into the second structure 1100S. The bit lines BL may be electrically connected to the page buffer 1120 through second connection lines 1125, which are extended from the first structure 1100F to the second structure 1100S.

In the first structure 1100F, the decoder circuit 1110 and the page buffer 1120 may be configured to perform a control operation on at least selected ones of the memory cell transistors MCT. The decoder circuit 1110 and the page buffer 1120 may be controlled by the logic circuit 1130. The semiconductor device 1100 may communicate with the controller 1200 through an input/output pad 1101, which is electrically connected to the logic circuit 1130. The input/output pad 1101 may be electrically connected to the logic circuit 1130 through an input/output connection line 1135, which is extended from the first structure 1100F to the second structure 1100S.

The controller 1200 may include a processor 1210, a NAND controller 1220, and a host interface 1230. In an embodiment, the electronic system 1000 may include a plurality of semiconductor devices 1100, and in this case, the controller 1200 may control the semiconductor devices 1100.

The processor 1210 may control overall operations of the electronic system 1000 including the controller 1200. The processor 1210 may be operated based on a specific firmware and may control the NAND controller 1220 to access the semiconductor device 1100. The NAND controller 1220 may include a NAND interface 1221, which is used to communicate with the semiconductor device 1100. The NAND interface 1221 may be configured to transmit and receive control commands, which are used to control the semiconductor device 1100, data, which are written in or read from the memory cell transistors MCT of the semiconductor device 1100, and so forth. The host interface 1230 may be configured to allow for communication between the electronic system 1000 and an external host. When the processor 1210 receives a control command transmitted from the external host through the host interface 1230, the processor 1210 may control the semiconductor device 1100 in response to the control command.

Figure 2:
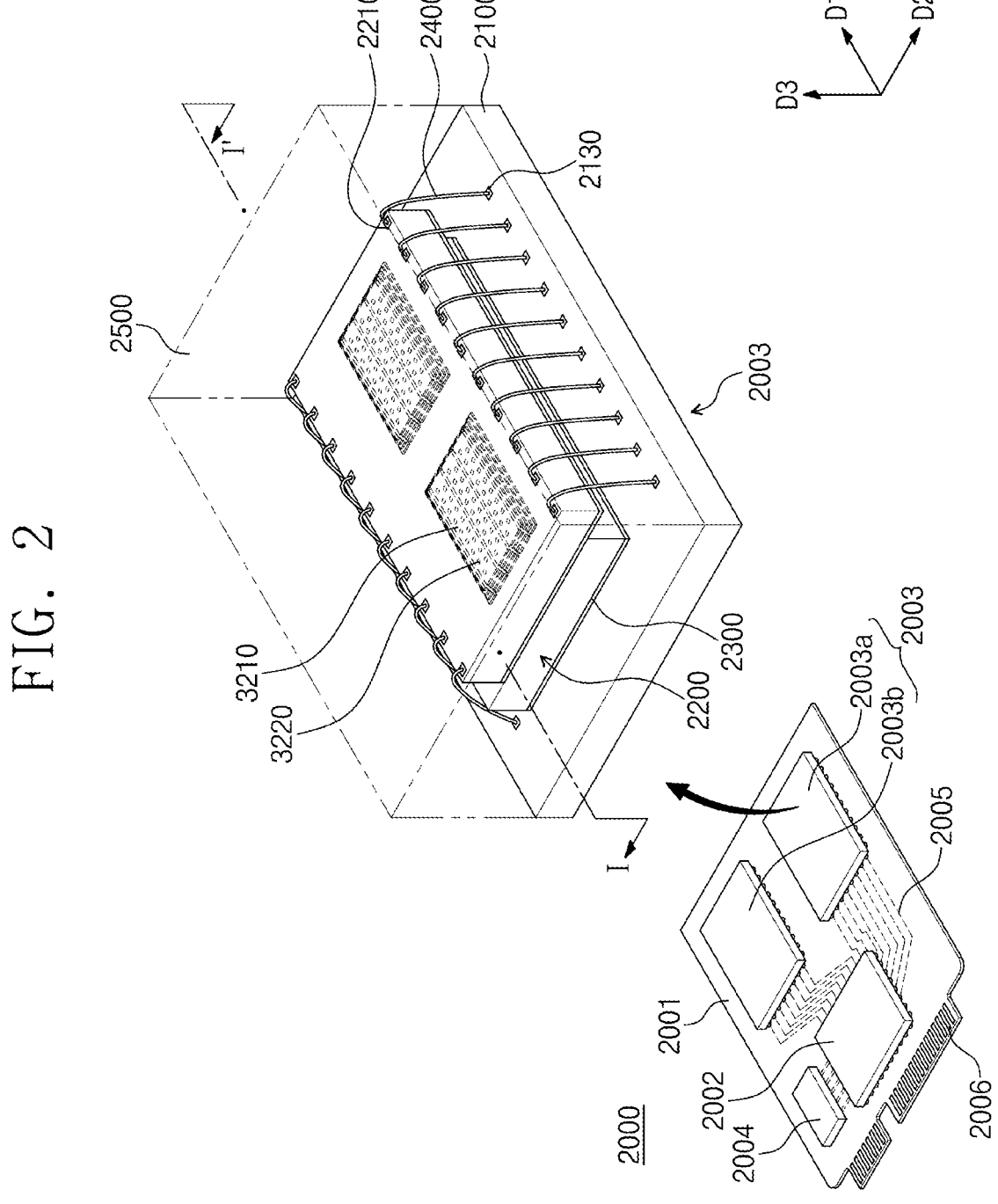
FIG. 2 is a perspective view schematically illustrating an electronic system including a semiconductor device according to an embodiment.

FIG. 2 is a perspective view schematically illustrating an electronic system including a semiconductor device according to an embodiment.

Referring to FIG. 2, an electronic system 2000 according to an embodiment may include a main substrate 2001 and a controller 2002, at least one semiconductor package 2003, and a dynamic random-access memory (DRAM) 2004, which are mounted on the main substrate 2001. The semiconductor package 2003 and the DRAM 2004 may be connected to the controller 2002 by interconnection patterns 2005, which are formed in the main substrate 2001.

The main substrate 2001 may include a connector 2006, which includes a plurality of pins coupled to an external host. In the connector 2006, the number and arrangement of the pins may be changed depending on a communication interface between the electronic system 2000 and the external host. In an embodiment, the electronic system 2000 may communicate with the external host, in accordance with one of interfaces, e.g., universal serial bus (USB), peripheral component interconnect express (PCI-Express), serial advanced technology attachment (SATA), universal flash storage (UFS) M-Phy, or the like. In an embodiment, the electronic system 2000 may be driven by a power, which is supplied from the external host through the connector 2006. The electronic system 2000 may further include a Power Management Integrated Circuit (PMIC) that is configured to distribute power, which is supplied from the external host, to the controller 2002 and the semiconductor package 2003. The controller 2002 may be configured to control a writing or reading operation on the semiconductor package 2003 and to improve an operation speed of the electronic system 2000.

The DRAM 2004 may be a buffer memory, which relieves technical difficulties caused by a difference in speed between the semiconductor package 2003, which serves as a data storage device, and an external host. In an embodiment, the DRAM 2004 in the electronic system 2000 may serve as a cache memory and may be used as a storage space, which is configured to store data temporarily during a control operation on the semiconductor package 2003. In the case where the electronic system 2000 includes the DRAM 2004, the controller 2002 may further include a DRAM controller for controlling the DRAM 2004, in addition to a NAND controller for controlling the semiconductor package 2003.

The semiconductor package 2003 may include first and second semiconductor packages 2003*a* and 2003*b* spaced apart from each other. Each of the first and second semiconductor packages 2003*a* and 2003*b* may be a semiconductor package including a plurality of semiconductor chips 2200. Each of the first and second semiconductor packages 2003*a* and 2003*b* may include a package substrate 2100, the semiconductor chips 2200 on the package substrate 2100, adhesive layers 2300 disposed on respective bottom surfaces of the semiconductor chips 2200, a connection structure 2400 electrically connecting the semiconductor chips 2200 to the package substrate 2100, and a molding layer 2500 disposed on the package substrate 2100 to cover the semiconductor chips 2200 and the connection structure 2400.

The package substrate 2100 may be a printed circuit board including package upper pads 2130. Each of the semiconductor chips 2200 may include an input/output pad 2210. The input/output pad 2210 may correspond to the input/output pad 1101 of FIG. 1A. Each of the semiconductor chips 2200 may include gate stacks 3210 and vertical channel structures 3220. Each of the semiconductor chips 2200 may include a semiconductor device, which will be described below, according to an embodiment.

In an embodiment, the connection structure 2400 may be a bonding wire, which is provided to electrically connect the input/output pad 2210 to the package upper pads 2130. Thus, in each of the first and second semiconductor packages 2003*a* and 2003*b*, the semiconductor chips 2200 may be electrically connected to each other in a bonding wire manner and may be electrically connected to the package upper pads 2130 of the package substrate 2100. Alternatively, in each of the first and second semiconductor packages 2003*a* and 2003*b*, the semiconductor chips 2200 may be electrically connected to each other by a connection structure including through-silicon vias (TSVs), not by the connection structure 2400 provided in the form of bonding wires.

In an embodiment, the controller 2002 and the semiconductor chips 2200 may be included in a single package. In an embodiment, the controller 2002 and the semiconductor chips 2200 may be mounted on an additional interposer substrate different from the main substrate 2001 and may be connected to each other through interconnection lines, which are provided in the interposer substrate.

Figure 3:
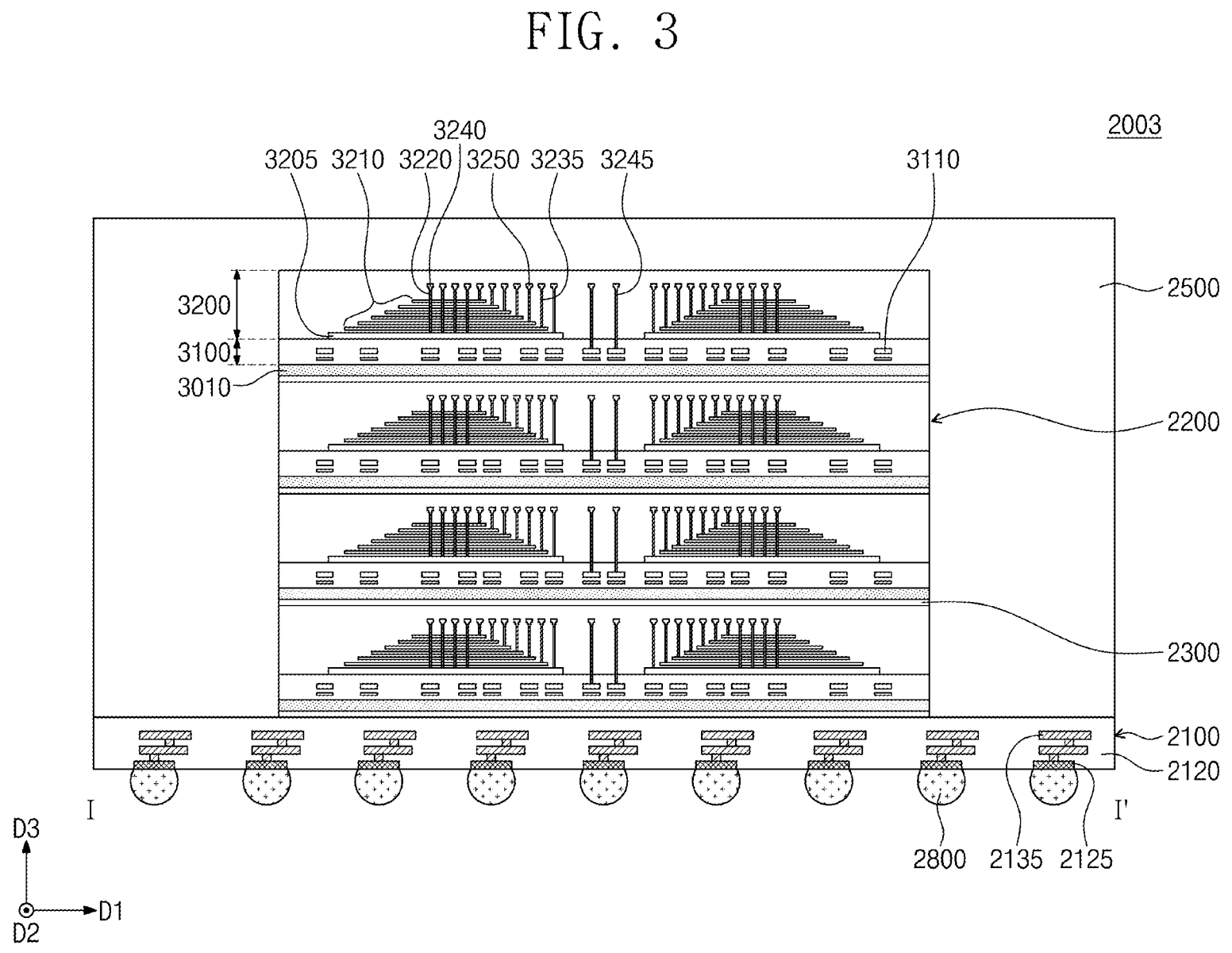
Figure 4:
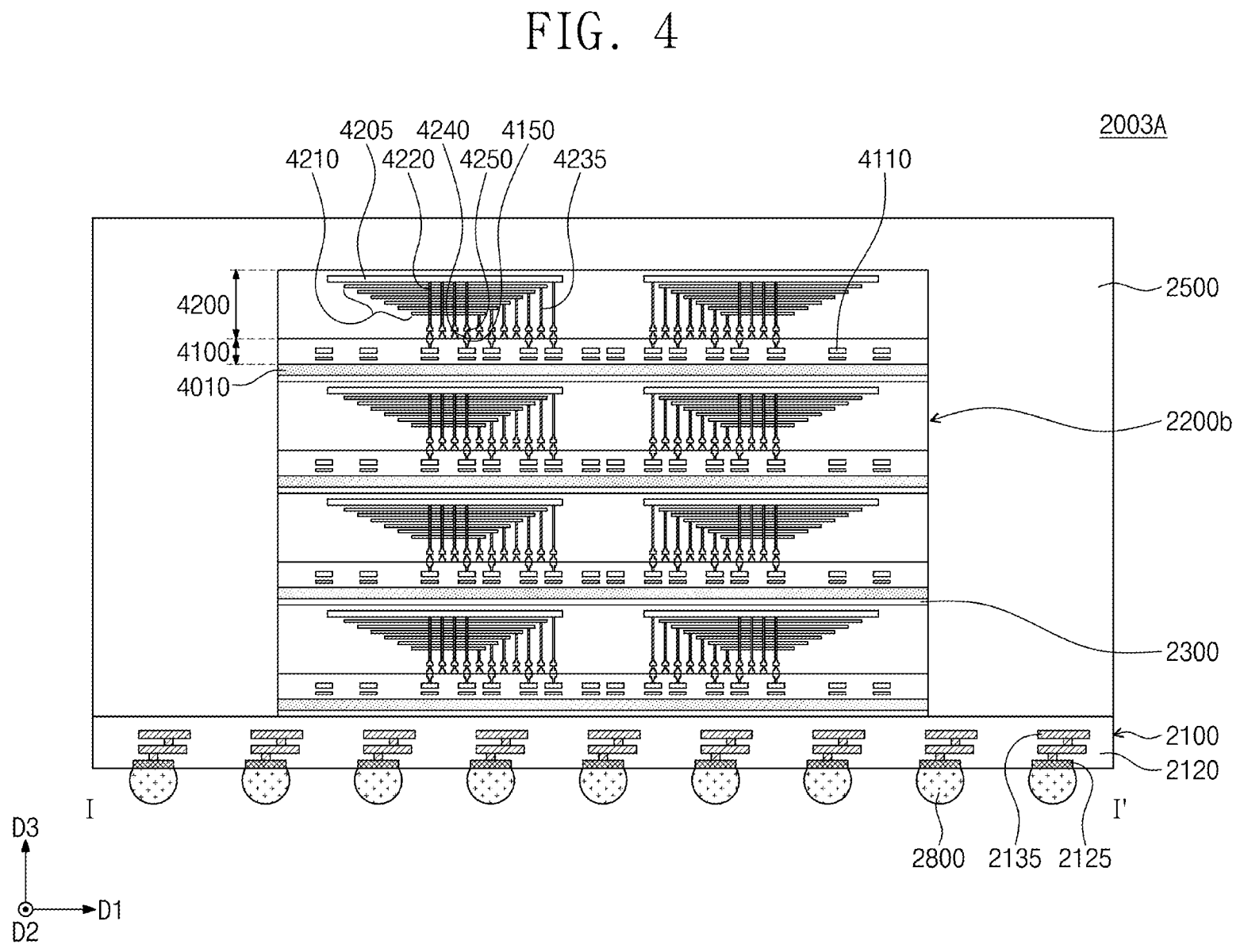

FIGS. 3 and 4 are sectional views along line I-I' of FIG. 2, and illustrate two different examples of the semiconductor package of FIG. 2.

Referring to FIG. 3, the package substrate 2100 of the semiconductor package 2003 may be a printed circuit board. The package substrate 2100 may include a package substrate body portion 2120, the package upper pads 2130 (e.g., see FIG. 2), which are disposed on a top surface of the package substrate body portion 2120, lower pads 2125, which are disposed on or exposed through a bottom surface of the package substrate body portion 2120, and internal lines 2135, which are disposed in the package substrate body portion 2120 to electrically connect the package upper pads 2130 to the lower pads 2125. The package upper pads 2130 may be electrically connected to the connection structures 2400. The lower pads 2125 may be connected to the interconnection patterns 2005 of the main substrate 2001 of the electronic system 2000 shown in FIG. 2 through conductive connecting portions 2800.

Each of the semiconductor chips 2200 may include a semiconductor substrate 3010 and a first structure 3100 and a second structure 3200, which are sequentially stacked on the semiconductor substrate 3010. The first structure 3100 may include a peripheral circuit region including peripheral lines 3110. The second structure 3200 may include a source structure 3205, a stack 3210 on the source structure 3205, the vertical channel structures 3220 penetrating the stack 3210, bit lines 3240 electrically connected to the vertical channel structures 3220, and gate connection lines 3235 and cell contact plugs 3250 electrically connected to the word lines WL (e.g., see FIG. 1) of the stack 3210.

Each of the semiconductor chips 2200 may include a penetration line 3245, which is electrically connected to the peripheral lines 3110 of the first structure 3100 and is extended into the second structure 3200. The penetration line 3245 may be disposed outside the stack 3210, and in an embodiment, the penetration line 3245 may be provided to further penetrate the stack 3210. Each of the semiconductor chips 2200 may further include the input/output pad 2210 (e.g., see FIG. 2), which is electrically connected to the peripheral lines 3110 of the first structure 3100.

Referring to FIG. 4, in the semiconductor package 2003A, each of the semiconductor chips 2200*b* may include a semiconductor substrate 4010, a first structure 4100 on the semiconductor substrate 4010, and a second structure 4200, which is provided on the first structure 4100 and is bonded to the first structure 4100 in a wafer bonding manner.

The first structure 4100 may include a peripheral circuit region including a peripheral line 4110 and first junction structures 4150. The second structure 4200 may include a source structure 4205, a stack 4210 between the source structure 4205 and the first structure 4100, vertical channel structures 4220 penetrating the stack 4210, bit lines 4240 electrically connected to the vertical channel structures 4220, and cell contact plugs 4235 electrically connected to the word lines WL (e.g., see FIG. 1) of the stack 4210.

The bit lines 4240 and the cell contact plugs 4235 may be electrically connected to the first junction structures 4150 of the first structure 4100 through second junction structures 4250. The second junction structures 4250 may be provided to be in contact with the first junction structures 4150, respectively, or may be bonded to the first junction structures 4150, respectively. The first junction structures 4150 and the second junction structures 4250 may be formed of or include copper (Cu). Each of the semiconductor chips 2200b may further include the input/output pad 2210 (e.g., see FIG. 2), which is electrically connected to the peripheral line 4110 of the first structure 4100.

The semiconductor chips 2200 of FIG. 3 may be electrically connected to each other through the connection structures 2400, which are provided in the form of bonding wires. The semiconductor chips 2200b of FIG. 4 may be electrically connected to each other through the connection structures 2400, which are provided in the form of bonding wires. However, in an embodiment, semiconductor chips, which are stacked in a single semiconductor package, e.g., the semiconductor chips 2200 of FIG. 3 or the semiconductor chips 2200b of FIG. 4, may be electrically connected to each other by through-silicon vias (TSVs).

The first structure 3100 of FIG. 3 and the first structure 4100 of FIG. 4 may correspond to a lower level layer in embodiments to be described below. The second structure 3200 of FIG. 3 and the second structure 4200 of FIG. 4 may correspond to an upper level layer in the embodiments to be described below.

Figure 5:
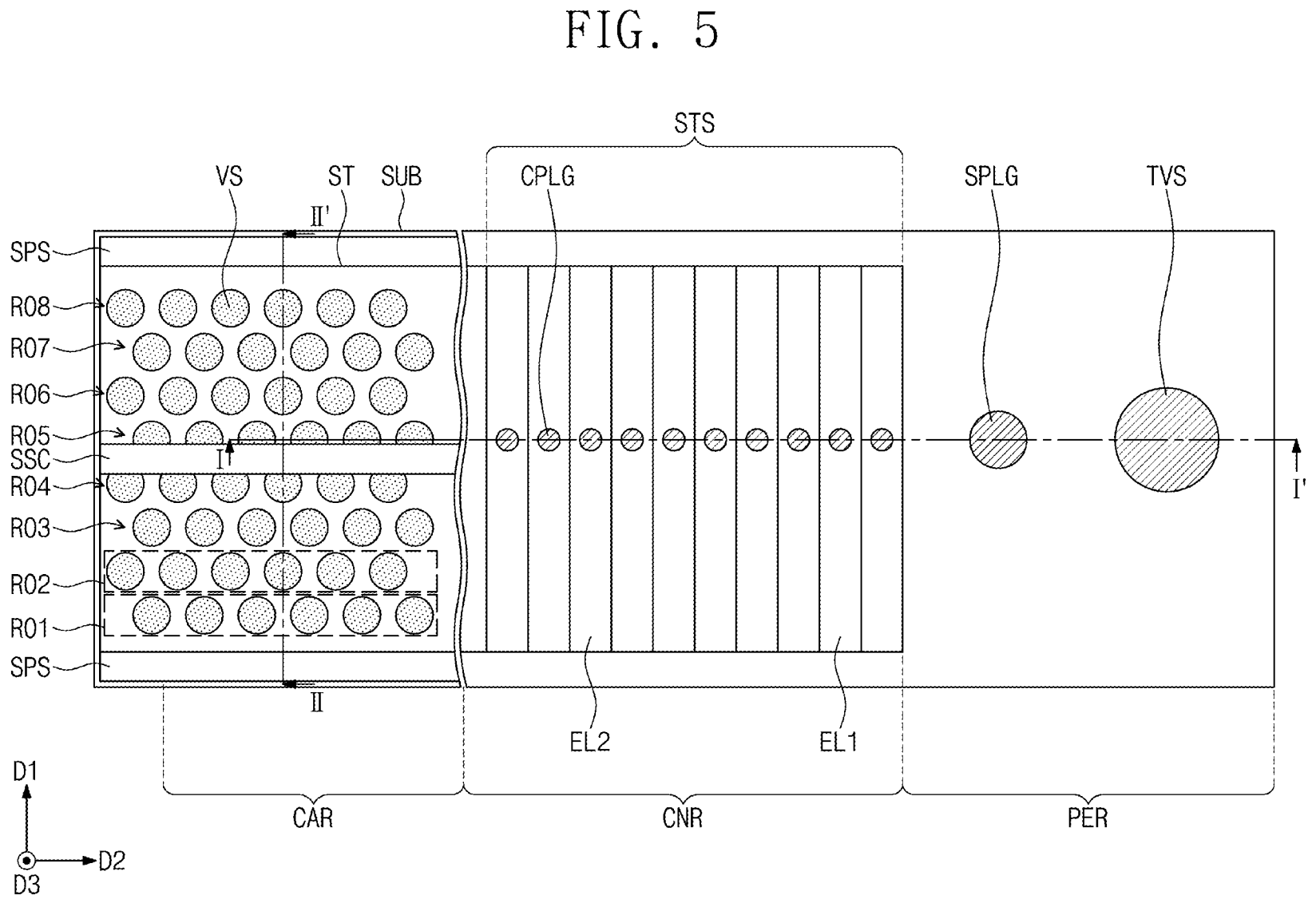
Figure 6A:
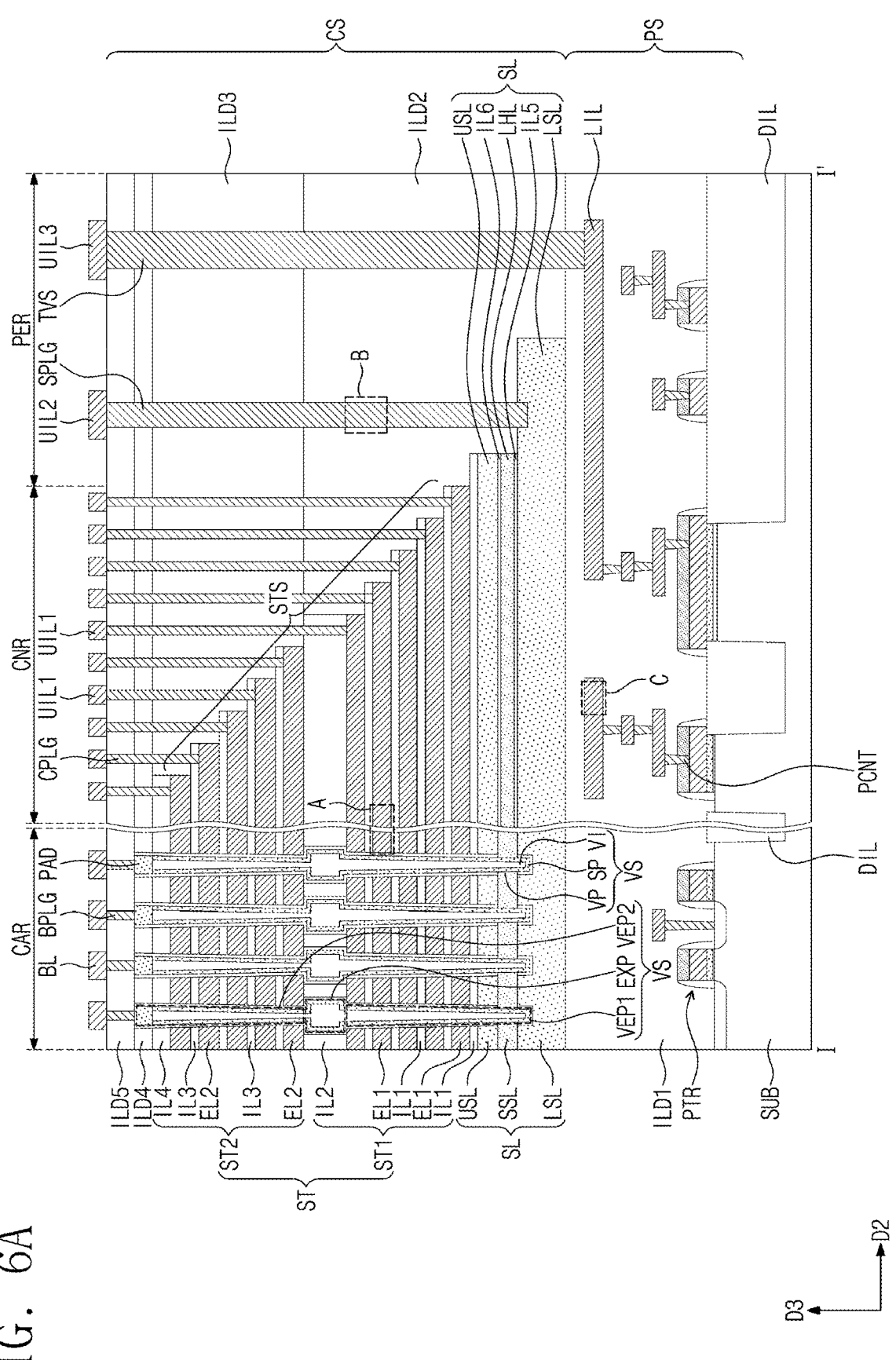
FIG. 6A is a sectional view taken along a line I-I' of FIG. 5.
Figure 6B:
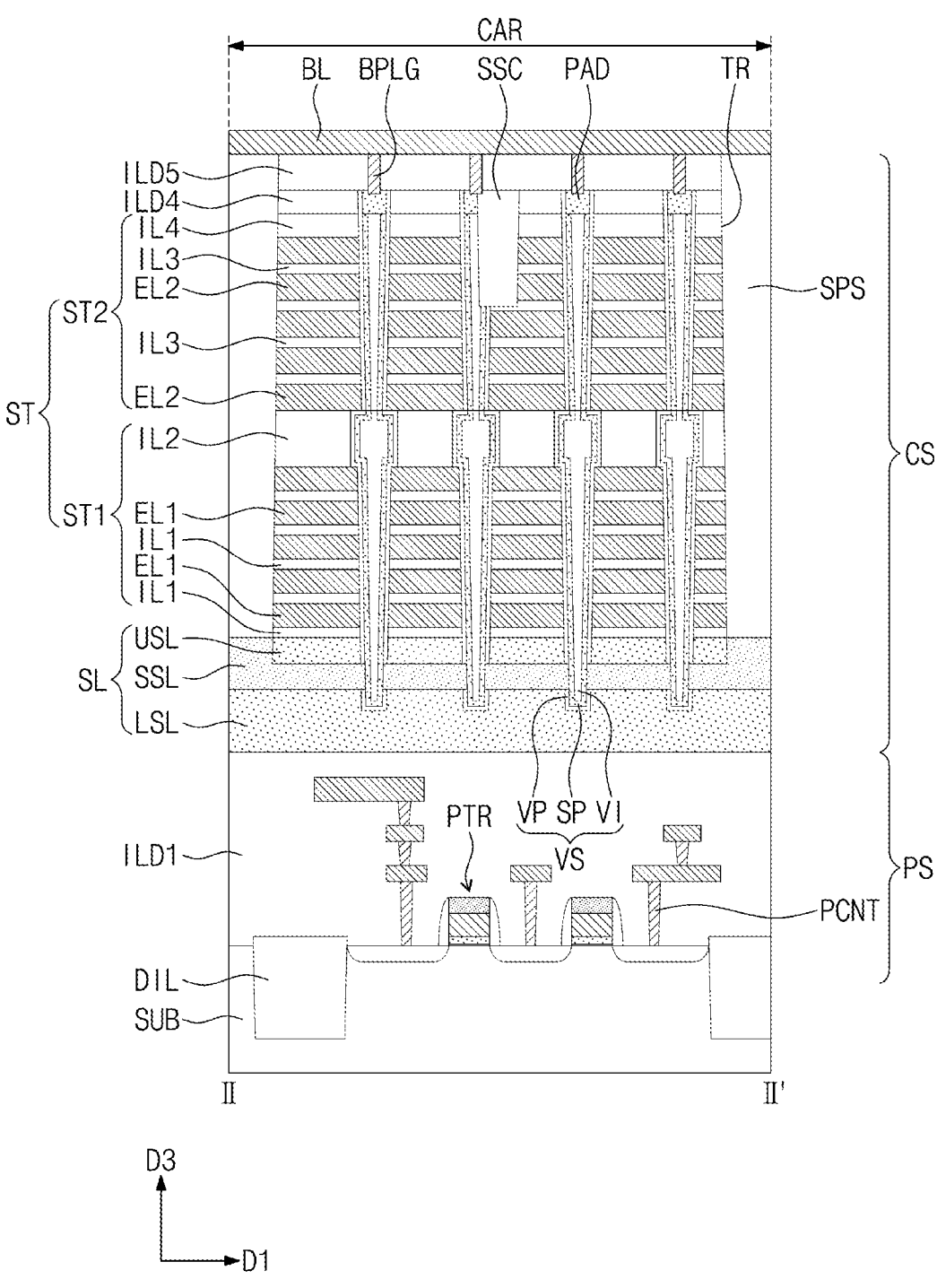
FIG. 6B is a sectional view taken along a line II-II' of FIG. 5.
Figure 7:
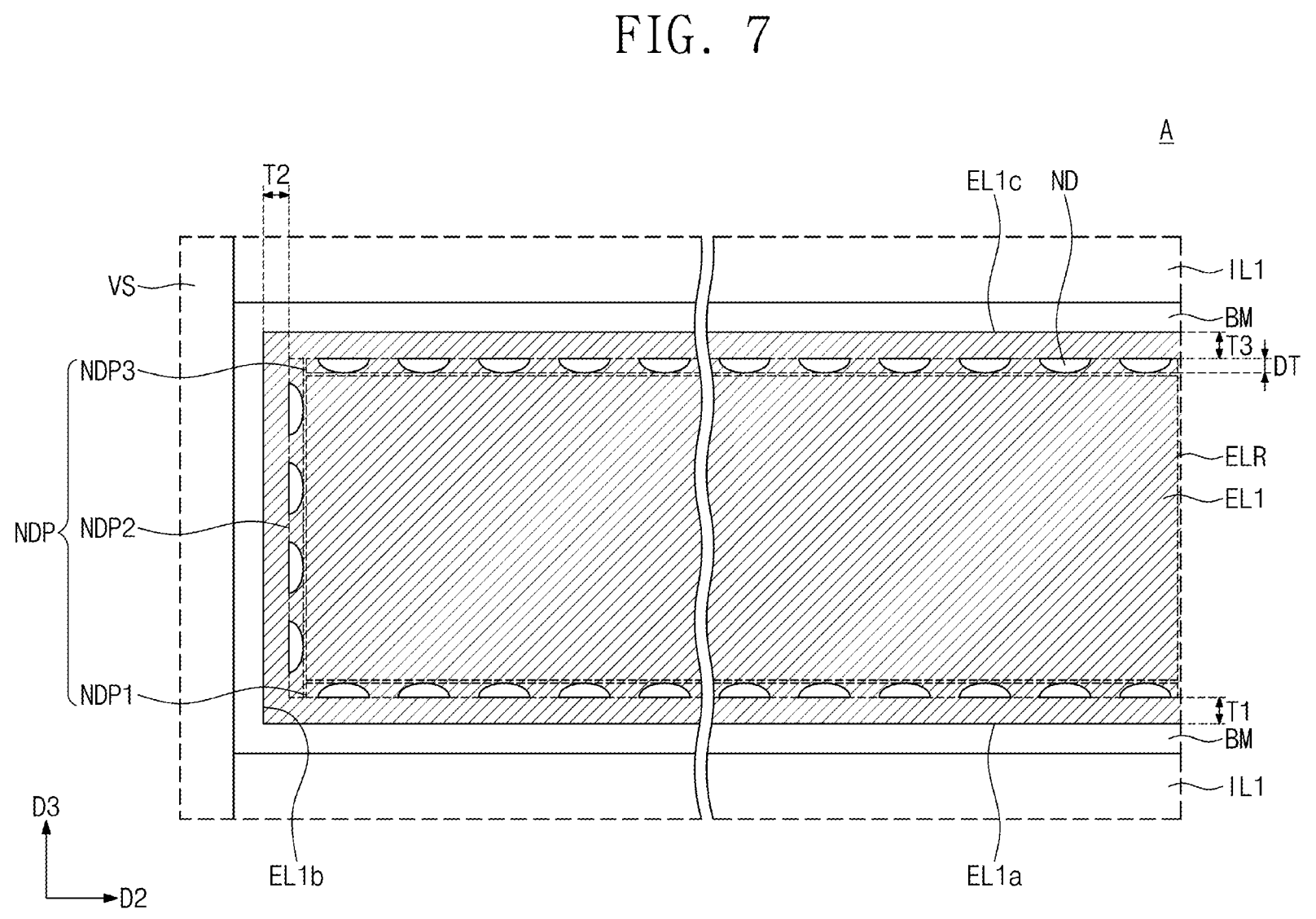
Figure 8:
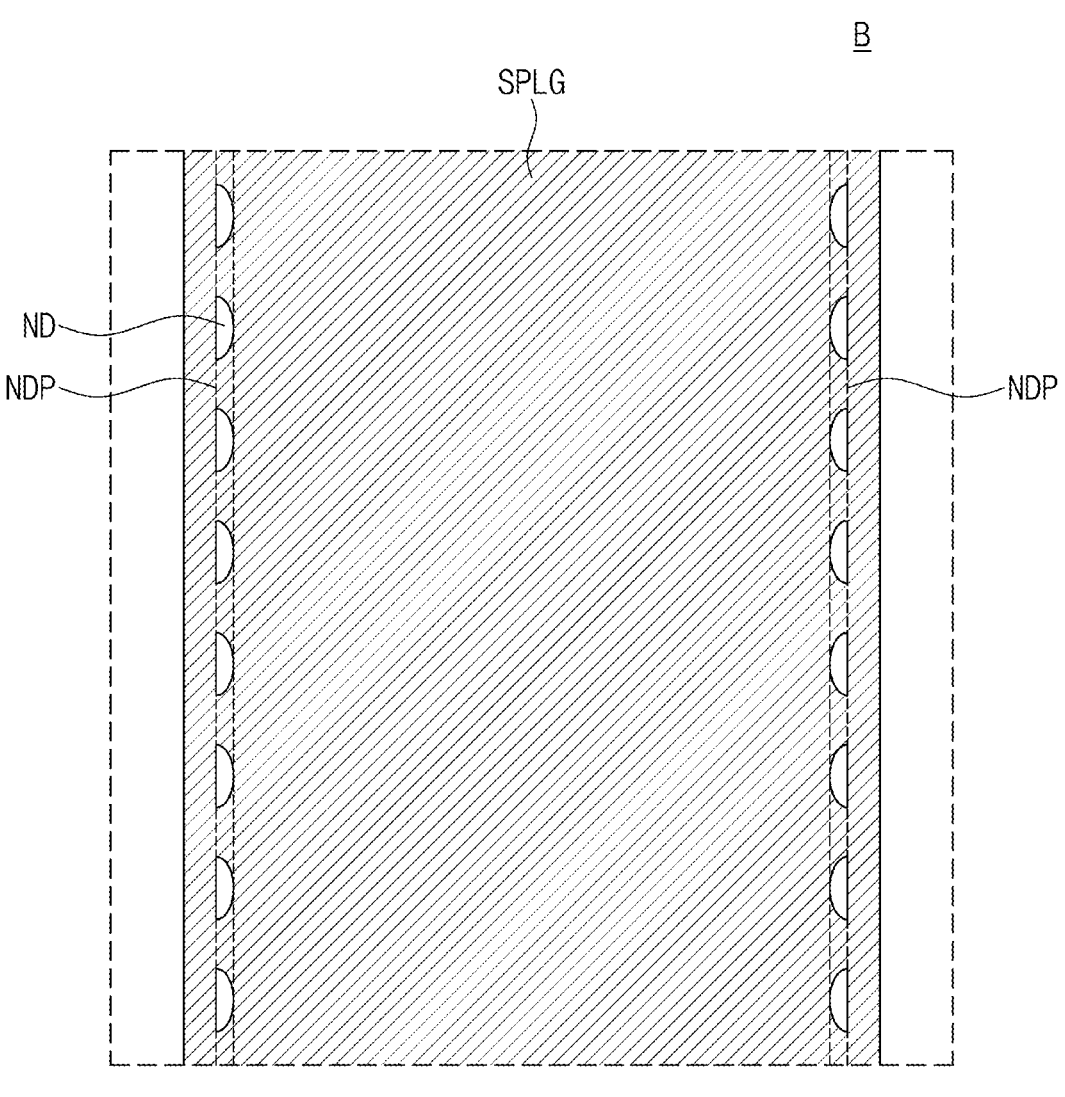
FIG. 8 is an enlarged sectional view illustrating a portion 'B' of FIG. 6A.
Figure 8:
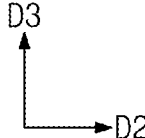
Figure 9:
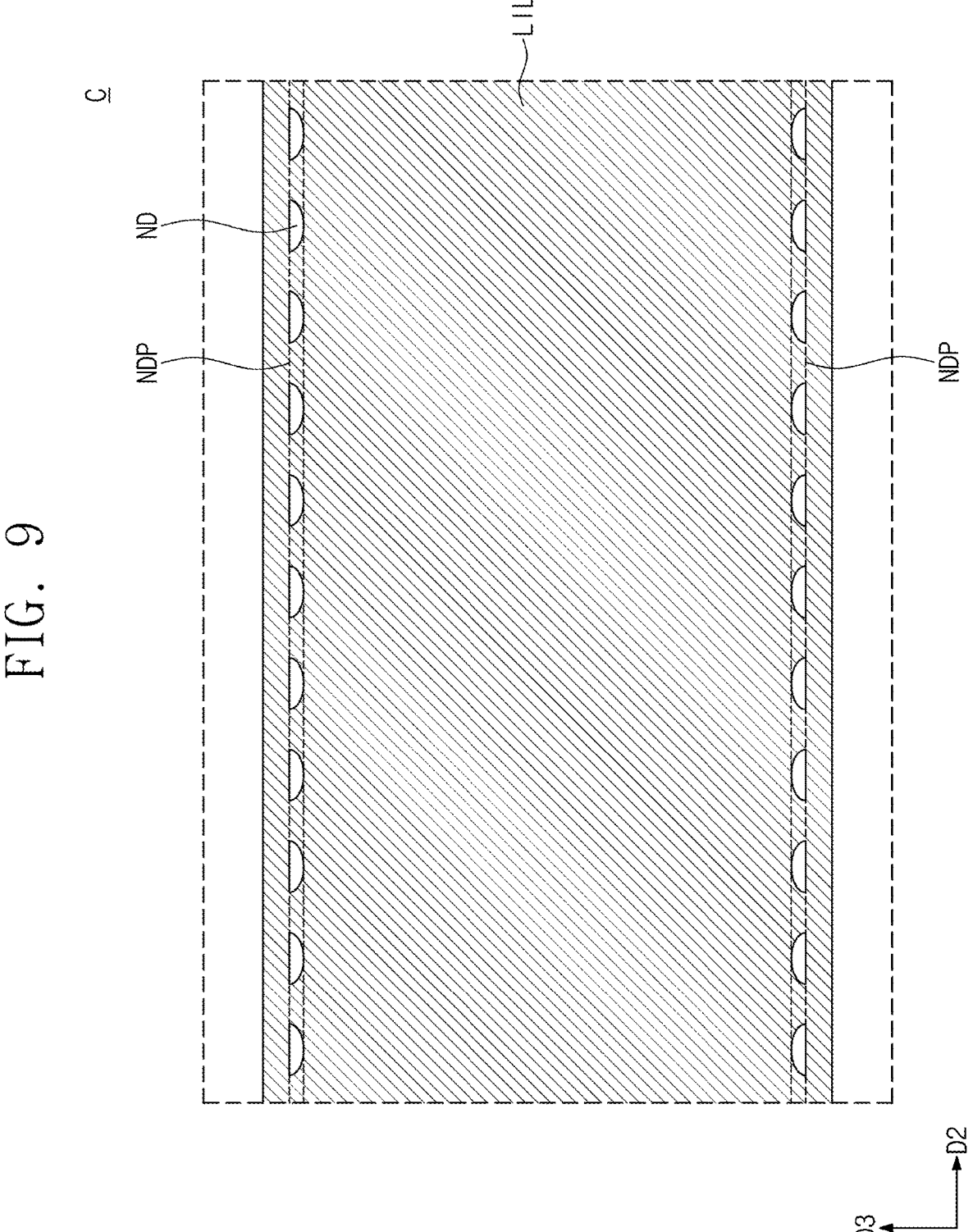
FIG. 9 is an enlarged sectional view illustrating a portion 'C' of FIG. 6A.

FIG. 5 is a plan view illustrating a semiconductor device according to an embodiment. FIG. 6A is a sectional view taken along line I-I' of FIG. 5, and FIG. 6B is a sectional view taken along line II-II' of FIG. 5. FIG. 7 is an enlarged sectional view illustrating portion 'A' of FIG. 6A, FIG. 8 is an enlarged sectional view illustrating portion 'B' of FIG. 6A, and FIG. 9 is an enlarged sectional view illustrating portion 'C' of FIG. 6A.

Referring to FIGS. 5, 6A, 6B, and 7 to 9, a lower level layer PS including peripheral transistors PTR may be disposed on a first substrate SUB. An upper level layer CS including a cell array structure ST may be disposed on the lower level layer PS. The first substrate SUB may be, e.g., a silicon substrate, a silicon germanium substrate, a germanium substrate, or a single crystalline epitaxial layer grown on a single crystalline silicon substrate. The first substrate SUB may include active regions defined by a device isolation layer DIL.

The lower level layer PS may include the peripheral transistors PTR, which are disposed on the active regions of the first substrate SUB. As described above, the peripheral transistors PTR may constitute the row and column decoders, the page buffer, the control circuit, the peripheral logic circuit, or the like.

The lower level layer PS may include a peripheral circuit including a decoder circuit, a page buffer, and a logic circuit. In detail, the lower level layer PS may further include lower interconnection lines LIL, which are provided on the peripheral transistors PTR, and a first interlayer insulating layer ILD1, which is provided to cover the peripheral transistors PTR and the lower interconnection lines LIL. A peripheral contact PCNT may be provided between the lower interconnection line LIL and the peripheral transistor PTR to electrically connect them to each other. The first interlayer insulating layer ILD1 may have a multi-layered structure including a plurality of stacked insulating layers. For example, the first interlayer insulating layer ILD1 may include a silicon oxide layer, a silicon nitride layer, a silicon oxynitride layer, and/or a low-k dielectric layer. The upper level layer CS may be provided on the first interlayer insulating layer ILD1 of the lower level layer PS. The upper level layer CS will be described in more detail below.

The upper level layer CS may include a cell array region CAR, a cell contact region CNR, and a peripheral region PER. The cell contact region CNR may be located between the cell array region CAR and the peripheral region PER. The peripheral region PER may be an outer edge region of a semiconductor chip.

A second substrate SL may be provided on the first interlayer insulating layer ILD1. The second substrate SL may support the cell array structure ST provided on the cell array region CAR. The second substrate SL of the cell array region CAR may include a lower semiconductor layer LSL, a source semiconductor layer SSL, and an upper semiconductor layer USL, which are sequentially stacked. Each of the lower semiconductor layer LSL, the source semiconductor layer SSL, and the upper semiconductor layer USL may be formed of or include at least one semiconductor material (e.g., at least one of silicon (Si), germanium (Ge), silicon germanium (SiGe), gallium arsenic (GaAs), indium gallium arsenic (InGaAs), aluminum gallium arsenic (AlGaAs), or mixtures thereof). Each of the lower semiconductor layer LSL, the source semiconductor layer SSL, and the upper semiconductor layer USL may have a single crystalline, amorphous, and/or polycrystalline structure. As an example, each of the lower semiconductor layer LSL, the source semiconductor layer SSL, and the upper semiconductor layer USL may include an n-type poly-silicon layer doped with impurities. The lower semiconductor layer LSL, the source semiconductor layer SSL, and the upper semiconductor layer USL may have doping concentrations that are different from each other.

The source semiconductor layer SSL may be interposed between the lower semiconductor layer LSL and the upper semiconductor layer USL. The lower semiconductor layer LSL and the upper semiconductor layer USL may be electrically connected to each other by the source semiconductor layer SSL.

The second substrate SL of the cell contact region CNR may include the lower semiconductor layer LSL, a fifth insulating layer IL5, a lower sacrificial layer LHL, a sixth insulating layer IL6, and the upper semiconductor layer USL, which are sequentially stacked. The fifth and sixth insulating layers IL5 and IL6 may include a silicon oxide layer, and the lower sacrificial layer LHL may include a silicon nitride layer or a silicon oxynitride layer.

The lower semiconductor layer LSL of the second substrate SL may be extended from the cell array region CAR to the peripheral region PER. The lower semiconductor layer LSL may be extended to a portion of the peripheral region PER but may not be extended to another portion of the peripheral region PER. In other words, the peripheral region PER may include a portion, in which the lower semiconductor layer LSL is not provided.

The cell array structure ST may be provided on the cell array region CAR and the cell contact region CNR of the second substrate SL. The cell array structure ST may include a first stack ST1 and a second stack ST2 on the first stack ST1. A second interlayer insulating layer ILD2 and a third interlayer insulating layer ILD3 may be provided on the second substrate SL. A top surface of the second interlayer insulating layer ILD2 may be coplanar with a top surface of the first stack ST1. A top surface of the third interlayer insulating layer ILD3 may be coplanar with a top surface of the second stack ST2. The second and third interlayer insulating layers ILD2 and ILD3 may cover a staircase structure STS of the cell array structure ST.

The first stack ST1 may include first electrodes ELL which are stacked in a direction (i.e., a third direction D3) perpendicular to the second substrate SL. The first stack ST1 may further include first insulating layers IL1 separating the stacked first electrodes EL1 from each other. The first insulating layers IL1 and the first electrodes EL1 may be alternately stacked in the first stack ST1. A second insulating layer IL2 may be provided as the uppermost layer of the first stack ST1. The second insulating layer IL2 may be thicker than each of the first insulating layers IL1.

The second stack ST2 may include second electrodes EL2, which are stacked on the first stack ST1 in the third direction D3. The second stack ST2 may further include third insulating layers IL3, which separate the stacked second electrodes EL2 from each other. The third insulating layers IL3 and the second electrodes EL2 of the second stack ST2 may be alternately stacked. A fourth insulating layer IL4 may be provided as the uppermost layer of the second stack ST2. The fourth insulating layer IL4 may be thicker than each of the third insulating layers IL3.

The cell array structure ST may include the staircase structure STS on the cell contact region CNR. The staircase structure STS may be a portion of the cell array structure ST, which is extended from the cell array region CAR to the cell contact region CNR in a second direction D2. In other words, the first and second electrodes EL1 and EL2 of the cell array structure ST may constitute the staircase structure STS that is extended from the cell array region CAR to the cell contact region CNR. The staircase structure STS on the cell contact region CNR may be connected to the cell array structure ST on the cell array region CAR. A height of the staircase structure STS may decrease with decreasing distance to the peripheral region PER. In other words, the height of the staircase structure STS may decrease with decreasing distance to the second direction D2.

The lowermost one of the first electrodes EL1 of the cell array structure ST may serve as the first lower selection line LL1 (e.g., see FIG. 1), and the next lowermost one of the first electrodes EL1 on the lowermost first electrode EL1 may serve as the second lower selection line LL2 (e.g., see FIG. 1). The uppermost one of the second electrodes EL2 of the cell array structure ST may serve as the first string selection line UL1 (e.g., see FIG. 1), and the next uppermost one of the second electrodes EL2 below the uppermost second electrode EL2 may serve as the second string selection line UL2 (e.g., see FIG. 1). The remaining ones of the first and second electrodes EL1 and EL2, except for the first and second lower selection lines and the first and second string selection lines, may serve as the word lines WL (e.g., see FIG. 1).

The first and second electrodes EL1 and EL2 may include end portions that are provided to constitute the staircase structure STS. For example, the end portions of the first and second electrodes EL1 and EL2 may be sequentially stacked to have horizontal lengths different from each other in the second direction D2 and may be exposed to the outside of the cell array structure ST.

For example, the first and second electrodes EL1 and EL2 may be formed of or include at least one conductive material of doped semiconductor materials (e.g., doped silicon), metallic materials (e.g., tungsten, copper, aluminum, titanium or tantalum), conductive metal nitrides (e.g., titanium nitride or tantalum nitride), etc. At least one of the first to fourth insulating layers IL1 to IL4 may include a silicon oxide layer.

A plurality of vertical channel structures VS may be provided on the cell array region CAR to penetrate the cell array structure ST. Each of the vertical channel structures VS may include a vertical insulating pattern VP, a vertical semiconductor pattern SP, and an insulating gapfill pattern VI. The vertical semiconductor pattern SP may be interposed between the vertical insulating pattern VP and the insulating gapfill pattern VI. A conductive pad PAD may be provided in an upper portion of each of the vertical channel structures VS.

The insulating gapfill pattern VI may have a circular pillar shape. The vertical semiconductor pattern SP may be extended from the lower semiconductor layer LSL to the conductive pad PAD in the third direction D3 to cover a surface of the insulating gapfill pattern VI. The vertical semiconductor pattern SP may be shaped like a pipe with an open top end. The vertical insulating pattern VP may cover an outer surface of the vertical semiconductor pattern SP and may be extended from the lower semiconductor layer LSL to a top surface of a fourth interlayer insulating layer ILD4 in the third direction D3. The vertical insulating pattern VP may be shaped like a pipe with an open top end. The vertical insulating pattern VP may be interposed between the cell array structure ST and the vertical semiconductor pattern SP.

The vertical insulating pattern VP may include one or more layers. In an embodiment, the vertical insulating pattern VP may include a data storing layer. In an embodiment, the vertical insulating pattern VP may include a tunnel insulating layer, a charge storing layer, and a blocking insulating layer constituting a data storing layer of a NAND FLASH memory device.

For example, the charge storing layer may be a trap insulating layer, a floating gate electrode, or an insulating layer including conductive nanodots. The charge storing layer may include at least one of, e.g., a silicon nitride layer, a silicon oxynitride layer, a silicon-rich nitride layer, a nanocrystalline silicon layer, and a laminated trap layer. The tunnel insulating layer may be formed of or include a material whose band gap is larger than the charge storing layer. The tunnel insulating layer may include a high-k dielectric layer (e.g., an aluminum oxide layer and a hafnium oxide layer) or a silicon oxide layer. The blocking insulating layer may include a silicon oxide layer.

The vertical semiconductor pattern SP may be formed of or include at least one of semiconductor materials (e.g., silicon (Si), germanium (Ge), or mixtures thereof). In addition, the vertical semiconductor pattern SP may be formed of or include at least one of doped semiconductor materials or undoped (i.e., intrinsic) semiconductor materials. The vertical semiconductor pattern SP including the semiconductor material may be used as channel regions of transistors constituting a memory cell string.

The conductive pad PAD may cover a top surface of the vertical semiconductor pattern SP and a top surface of the insulating gapfill pattern VI. The conductive pad PAD may be formed of or include at least one of doped semiconductor materials or conductive materials. A bit line contact plug BPLG may be electrically connected to the vertical semiconductor pattern SP through the conductive pad PAD.

The source semiconductor layer SSL may be in direct contact with a lower sidewall of each of the vertical semiconductor patterns SP. The source semiconductor layer SSL may electrically connect the vertical semiconductor patterns SP to each other. For example, all of the vertical semiconductor patterns SP may be electrically connected to the second substrate SL. The second substrate SL may serve as source regions of memory cells. A common source voltage may be applied to the second substrate SL through a source contact plug SPLG, which will be described below.

Each of the vertical channel structures VS may include a first vertical extended portion VEP1 penetrating the first stack ST1, a second vertical extended portion VEP2 penetrating the second stack ST2, and an expanded portion EXP between the first and second vertical extended portions VEP1 and VEP2. The expanded portion EXP may be provided in the second insulating layer IL2.

The first vertical extended portion VEP1 may have a diameter increasing in an upward direction. The second vertical extended portion VEP2 may also have a diameter increasing in the upward direction. A diameter of the expanded portion EXP may be larger than the largest diameter of the first vertical extended portion VEP1 and may be larger than the largest diameter of the second vertical extended portion VEP2.

A plurality of separation structures SPS may be provided to penetrate the cell array structure ST (e.g., see FIG. 6B). The cell array structure ST may be horizontally divided into a plurality of structures by the separation structures SPS. For example, each electrode EL1 or EL2 in the cell array structure ST may be horizontally divided into a plurality of electrodes by the separation structures SPS. The separation structures SPS may be formed of or include at least one insulating material (e.g., silicon oxide).

The fourth interlayer insulating layer ILD4 may be provided on the cell array structure ST and the third interlayer insulating layer ILD3. A fifth interlayer insulating layer ILD5 may be provided on the fourth interlayer insulating layer ILD4.

Bit line contact plugs BPLG may be provided to penetrate the fifth interlayer insulating layer ILD5 and may be coupled to the conductive pads PAD, respectively. The bit lines BL may be disposed on the fifth interlayer insulating layer ILD5. The bit lines BL may be extended in the first direction D1 to be parallel to each other. The bit lines BL may be electrically connected to the vertical channel structures VS, respectively, through the bit line contact plugs BPLG.

A plurality of first upper interconnection lines UIL1 may be provided on the fifth interlayer insulating layer ILD5 of the cell contact region CNR. Cell contact plugs CPLG may be provided to vertically extend from the first upper interconnection lines UIL1 to the staircase structure STS.

The cell contact plugs CPLG may be respectively coupled to exposed portions of the first and second electrodes EL1 and EL2 of the staircase structure STS. The cell contact plugs CPLG may be sequentially coupled to end portions of the first and second electrodes EL1 and EL2, respectively. The first and second electrodes EL1 and EL2 may be electrically connected to the first upper interconnection lines UIL1, respectively, through the cell contact plugs CPLG.

A second upper interconnection line UIL2 may be provided on the fifth interlayer insulating layer ILD5 of the peripheral region PER. The source contact plug SPLG may be provided to vertically extend from the second upper interconnection line UIL2 to the lower semiconductor layer LSL. The second upper interconnection line UIL2 may be electrically connected to the second substrate SL through the source contact plug SPLG. A common source voltage may be applied to the second substrate SL through the second upper interconnection line UIL2 and the source contact plug SPLG.

A third upper interconnection line UIL3 may be provided on the fifth interlayer insulating layer ILD5 of the peripheral region PER. A through via TVS may be provided to vertically extend from the third upper interconnection line UIL3 to the lower interconnection line LIL of the lower level layer PS. The upper level layer CS may be electrically connected to the lower level layer PS through the through via TVS.

Referring back to FIGS. 5 and 6B, a cutting structure SSC may be provided on the cell array region CAR. The cutting structure SSC may be extended in the second direction D2 to cross an upper portion of the cell array structure ST. The cutting structure SSC may have a line shape, when viewed in a plan view.

The vertical channel structures VS may be two-dimensionally arranged to form, e.g., first to eighth rows RO1-RO8 (FIG. 5). The first to eighth rows RO1-RO8 may be arranged in the first direction D1 to be spaced apart from each other by a constant distance. The vertical channel structures VS in each of the first to eighth rows RO1-RO8 may be arranged in the second direction D2 to be spaced apart from each other with the same pitch.

The vertical channel structures VS in adjacent rows may be offset from each other in the second direction D2. For example, the vertical channel structures VS of the first row RO1 may be offset from the vertical channel structures VS of the second row RO2 in the second direction D2.

The cutting structure SSC may be provided between the fourth row RO4 and the fifth row RO5 and may be extended in the second direction D2. The cutting structure SSC may be vertically overlapped, e.g., as viewed in a top view, with at least a portion of each of the vertical channel structures VS of the fourth and fifth rows RO4 and RO5. In other words, the cutting structure SSC may be extended to cross the vertical channel structures VS of the fourth and fifth rows RO4 and RO5.

In an embodiment, the cutting structure SSC may be provided to penetrate the uppermost one (e.g., the first string selection line UL1 of FIG. 1) and the next uppermost one (e.g., the second string selection line UL2 of FIG. 1) of the second electrodes EL2. The first string selection line UL1 (e.g., of FIG. 1) may be divided into two lines by the cutting structure SSC. The second string selection line UL2 (e.g., of FIG. 1) may also be divided into two lines by the cutting structure SSC. The cutting structure SSC may partially penetrate the conductive pad PAD. The cutting structure SSC may be provided to partially penetrate an upper portion of the vertical channel structure VS.

Referring back to FIGS. 6A and 7, each of the first and second stacks ST1 and ST2 may include an electrode insulating layer BM. The following description will be given with reference to the first electrode EL1 placed in portion 'A' of FIG. 6A.

The electrode insulating layer BM may be provided on a top surface EL1c and a bottom surface EL1a of the first electrodes EL1, e.g., between each of the first electrodes EL1 and an adjacent first insulating layer IL1. The electrode insulating layer BM may also be provided between the vertical channel structures VS and the first electrode EL1, e.g., on a side surface EL1b of the first electrode EL1 facing the vertical channel structure VS. The electrode insulating layer BM may be provided between the vertical insulating pattern VP of the vertical channel structure VS and the first electrode EL1. For example, the electrode insulating layer BM may be provided to enclose the first electrode EL1. The electrode insulating layer BM may be formed of or include at least one of, e.g., aluminum oxide or hafnium oxide.

Some of the elements contained in the first electrode EL1 may pass through the electrode insulating layer BM. For example, fluorine or nitrogen atoms contained in the first electrode EL1 may be thermally diffused to pass through the electrode insulating layer BM. Other elements in the first electrode EL1 may not pass through the electrode insulating layer BM. For example, tungsten atoms in the first electrode EL1 may not pass through the electrode insulating layer BM and may be isolated in the first electrode EL1. That is, the electrode insulating layer BM may be used to prevent a conductive material in the first electrode EL1 from being diffused into the vertical channel structure VS or the first insulating layer IL1.

The first electrode EL1 may include a nano dot pattern NDP. The nano dot pattern NDP may include a first pattern NDP1, a second pattern NDP2, and a third pattern NDP3. Each of the first to third patterns NDP1, NDP2, and NDP3 may include a plurality of nano dots ND. For example, as illustrated in FIG. 7, each of the first to third patterns NDP1, NDP2, and NDP3 may be within the first electrode EL1, and may be spaced apart from a corresponding outer surface one of the first electrode EL1.

The first pattern NDP1 may be disposed on the bottom surface EL1a of the first electrode EL1 and may be extended along the bottom surface EL1a of the first electrode EL1, e.g., the first pattern NDP1 may extend continuously in the second direction D2 along the bottom surface EL1a of the first electrode EL1. The first pattern NDP1 may be spaced apart from the bottom surface EL1a of the first electrode EL1 by a first distance T1 in a direction perpendicular to the bottom surface EL1a (i.e., in the third direction D3). In other words, the nano dots ND of the first pattern NDP1 may be horizontally arranged (e.g., spaced apart from each other) in the first or second direction D1 or D2 while being spaced apart from the bottom surface EL1a of the first electrode EL1 by the first distance T1 along the third direction D3. Each of the nano dots ND of the first pattern NDP1 may have a flat bottom surface and an upward convex shape. For example, in each of the nano dots ND of the first pattern NDP1, a surface adjacent to, e.g., and facing, the bottom surface EL1a of the first electrode EL1 may be flat, and a surface pointing toward the top surface EL1c of the first electrode EL1, e.g., a surface facing away from the bottom surface EL1a of the first electrode EL1, may be convex. The flat surfaces of the nano dots ND of the first pattern NDP1 may be placed on a straight line parallel to the bottom surface EL1a of the first electrode EL1, e.g., the flat surfaces of the nano dots ND of the first pattern NDP1 may be aligned to be coplanar with each other along the second direction D2 in parallel to the bottom surface EL1a of the first electrode EL1.

The second pattern NDP2 may be disposed on the side surface EL1b of the first electrode EL1 adjacent to the vertical channel structure VS and may be extended along the side surface EL1b of the first electrode EL1, i.e., in the third direction D3. The second pattern NDP2 may be spaced apart from the side surface EL1b of the first electrode EL1 by a second distance T2. In other words, the nano dots ND of the second pattern NDP2 may be arranged, e.g., spaced apart from each other, in the third direction D3 while being spaced apart from the side surface EL1b of the first electrode EL1 by the second distance T2. Each of the nano dots ND of the second pattern NDP2 may have a flat side surface and may have a laterally convex shape. For example, in each of the nano dots ND of the second pattern NDP2, a surface adjacent to, e.g., and facing, the vertical channel structure VS may be flat, and a surface pointing toward an inner portion of the first electrode EL1 may be convex. The flat surfaces of the nano dots ND of the second pattern NDP2 may be placed on a straight line.

The third pattern NDP3 may be disposed below the top surface EL1c of the first electrode EL1 and may be extended along the top surface EL1c of the first electrode EL1. The third pattern NDP3 may be spaced apart from the top surface EL1c of the first electrode EL1 by a third distance T3 in a downward direction perpendicular to the top surface EL1c. In other words, the nano dots ND of the third pattern NDP3 may be spaced apart from the top surface EL1c of the first electrode EL1 by the third distance T3 and may be horizontally arranged, e.g., spaced apart from each other, in the first or second direction D1 or D2. Each of the nano dots ND of the third pattern NDP3 may have a flat top surface and a downward convex shape. For example, in each of the nano dots ND of the third pattern NDP3, a surface adjacent to the top surface EL1c of the first electrode EL1 may be flat, and a surface pointing toward the bottom surface EL1a of the first electrode EL1 may be convex. The flat surfaces of the nano dots ND of the third pattern NDP3 may be placed on a straight line parallel to the top surface EL1c of the first electrode EL1.

The first distance T1 may be substantially equal to the third distance T3. The second distance T2 may be larger than or equal to the first distance T1. Each of the first to third distances T1, T2, and T3 may range from 5 angstroms to 15 angstroms.

The nano dots ND of the first pattern NDP1 and the nano dots ND of the third pattern NDP3 may be provided to have a mirror symmetry about a horizontal plane parallel to the first and second directions D1 and D2. The nano dots ND of the second pattern NDP2 may have a shape obtained by rotating the nano dots ND of the first pattern NDP1 by 90° in a clockwise direction or by rotating the nano dots ND of the third pattern NDP3 by 90° in a counterclockwise direction. In other words, each of the nano dots ND in the first to third patterns NDP1, NDP2, and NDP3 may have a shape obtained by rotating a specific one of the nano dots ND by 90° or 180°.

A thickness DT of the nano dot ND may be defined as the largest value of lengths measured from its flat portion to its convex portion in a direction normal to the flat portion. The thickness DT of each of the nano dots ND may range from 2 angstroms to 10 angstroms. Each of the nano dots ND may be formed of or include one of, e.g., TiN, TiSiN, TiAlN, TaN, TaSiN, or TaAlN. The nano dot ND may have a density of 2 g/cm$^3$ to 10 g/cm$^3$.

An internal electrode region ELR, which is, e.g., completely, enclosed by the nano dot pattern NDP, may be formed of or include a fluorine-containing material. In the case where the nano dot pattern NDP is not provided, the fluorine in the first electrode EL1 may be thermally diffused by heat, which is applied to the first electrode EL1, and may pass through the electrode insulating layer BM. In this case, the fluorine may enter the vertical channel structure VS, and this may lead to deterioration in electric characteristics of the vertical channel structure VS. However, according to an embodiment, due to the nano dot pattern NDP provided in the first electrode EL1, the fluorine in the internal electrode region ELR may not be diffused into the electrode insulating layer BM. In other words, according to an embodiment, the nano dot pattern NDP may prevent or substantially minimize diffusion of fluorine from the internal electrode region ELR into the vertical channel structure VS adjacent to the electrode.

The first electrode EL1 may be formed of or include at least one conductive material (e.g., tungsten). In the case where the nano dot pattern NDP is directly attached to the electrode insulating layer BM, titanium in the nano dot pattern NDP may pass through the electrode insulating layer BM, i.e., diffuse through the electrode insulating layer BM, when heat is applied to the first electrode EL1. In this case, the titanium diffused from the nano dot pattern NDP may enter the vertical insulating pattern VP of the vertical channel structure VS and may damage the data storing layer of the vertical insulating pattern VP. In contrast, according to an embodiment, since the nano dot pattern NDP is spaced apart from the electrode insulating layer BM, a portion of the first electrode EL1 may be disposed between the nano dot pattern NDP and the electrode insulating layer BM. Furthermore, since the nano dot pattern NDP is spaced apart from the electrode insulating layer BM, it is possible to prevent the titanium in the nano dot ND from passing through the electrode insulating layer BM, even when heat is applied to the nano dot pattern NDP.

Therefore, according to an embodiment, it is possible to prevent the vertical channel structure VS from being damaged, thereby improving electrical and operational characteristics of the semiconductor device, e.g., as compared with a structure without a nano dot pattern or with a structure having a nano dot structure directly connected to the electrode insulating layer BM.

Referring back to FIGS. 6A, 8, and 9, the nano dot pattern NDP may be provided not only in the electrodes but also in the contact plugs, the through vias, or the interconnection lines.

For example, as illustrated in FIG. 8, the nano dot pattern NDP may be provided in the source contact plug SPLG. The nano dots ND of the nano dot pattern NDP may be arranged along a sidewall of the source contact plug SPLG, e.g., in the third direction D3. In each of the nano dots ND, a surface facing the source contact plug SPLG may be flat, and an opposite surface facing an inner portion of the source contact plug SPLG may have a convex shape.

In another example, as illustrated in FIG. 9, the nano dot pattern NDP may be provided in the lower interconnection lines LIL. The nano dots ND of the nano dot pattern NDP may be horizontally arranged along top and bottom surfaces of the lower interconnection lines LIL. Each of the nano dots ND, which are adjacent to the top surface of the lower interconnection line LIL, may have a flat top surface and a downward convex shape, and each of the nano dots ND, which are adjacent to the bottom surface of the lower interconnection line LIL, may have a flat bottom surface and an upward convex shape.

Since the nano dot patterns NDP are provided in the contact plugs, the through vias, or the interconnection lines, it may be possible to prevent insulating layers, which are located near the same, from being damaged. As such, reliability of the semiconductor device may be improved.

Figure 22:
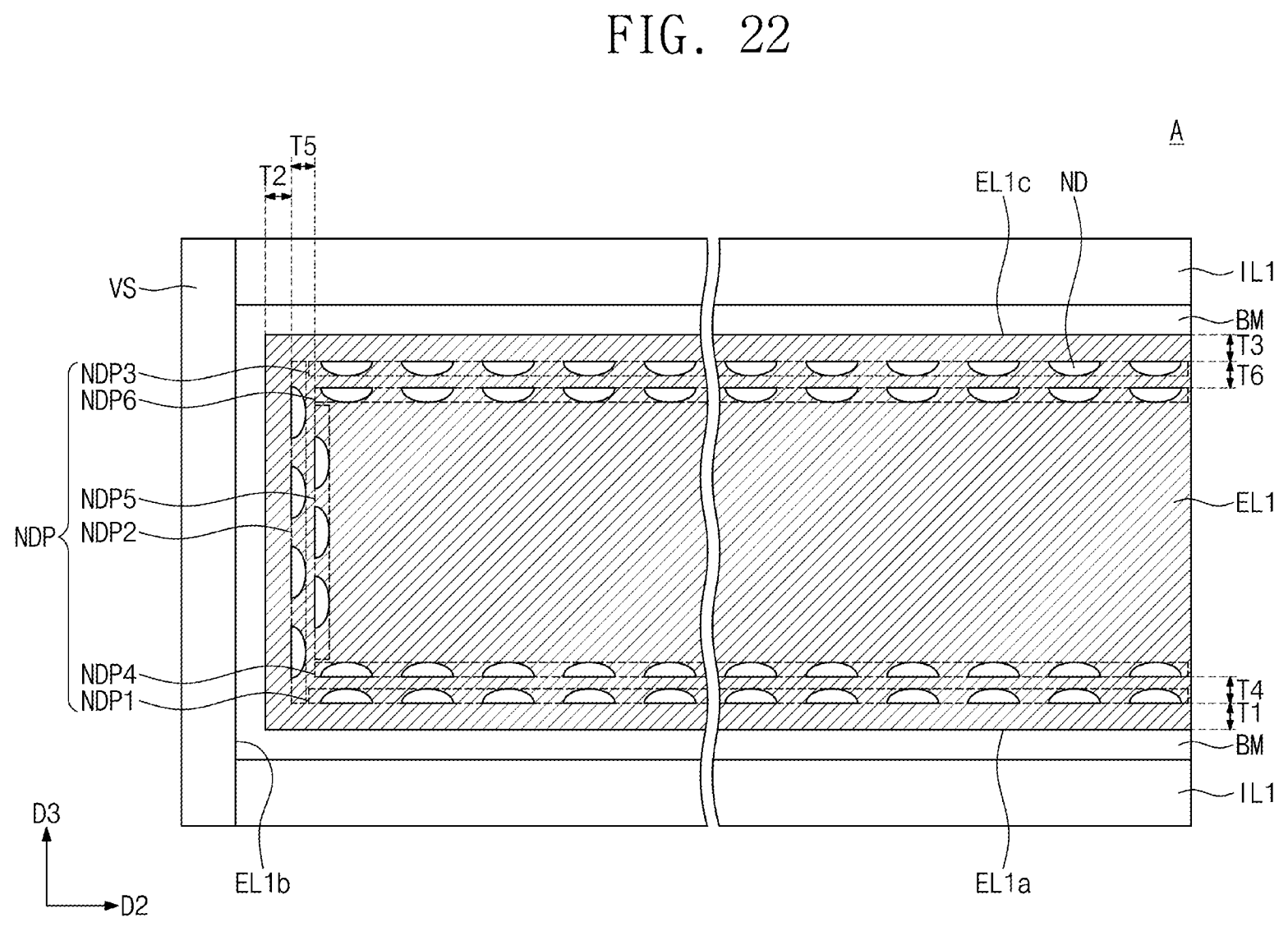

FIG. 22 is an enlarged sectional view illustrating a semiconductor device according to another embodiment and corresponding to portion 'A' of FIG. 6A. For the sake of brevity, only features different from those previously described with reference to FIGS. 5 to 7 will be mainly described below.

Referring to FIGS. 6A and 22, the nano dot pattern NDP may include a fourth pattern NDP4, a fifth pattern NDP5, and a sixth pattern NDP6. That is, FIG. 22 illustrates an example in which the nano dot pattern NDP is provided to have a double-layered structure. However, the nano dot pattern NDP may include more than two layers, e.g., the nano dot pattern NDP may be provided to have a multi-layered structure.

In detail, referring to FIG. 22, the fourth pattern NDP4 may be disposed on the bottom surface EL1a of the first electrode EL1 and may be extended along the bottom surface EL1a of the first electrode EL1. The fourth pattern NDP4 may be spaced apart from the first pattern NDP1 by a fourth distance T4 in the third direction D3. As an example, nano dots ND in the fourth pattern NDP4 may be provided to have substantially the same shape and arrangement as the nano dots ND in the first pattern NDP1. As another example, the nano dots ND of the fourth pattern NDP4 may be larger or smaller than the nano dots ND of the first pattern NDP1, and a distance between the nano dots ND arranged in the fourth pattern NDP4 may be larger or smaller than a distance between the nano dots ND arranged in the first pattern NDP1 (not shown).

The fifth pattern NDP5 may be disposed on the side surface EL1b of the first electrode EL1, which is adjacent to the vertical channel structure VS, and may be extended along the side surface EL1b of the first electrode EL1. The fifth pattern NDP5 may be spaced apart from the second pattern NDP2 by a fifth distance T5. As an example, nano dots ND in the fifth pattern NDP5 may be provided to have substantially the same shape and arrangement as the nano dots ND in the second pattern NDP2. As another example, the nano dots ND of the fifth pattern NDP5 may be larger or smaller than the nano dots ND of the second pattern NDP2, and a distance between the nano dots ND arranged in the fifth pattern NDP5 may be larger or smaller than a distance between the nano dots ND arranged in the second pattern NDP2 (not shown).

The sixth pattern NDP6 may be disposed on the top surface EL1c of the first electrode EL1 and may be extended along the top surface EL1c of the first electrode EL1. The sixth pattern NDP6 may be spaced apart from the third pattern NDP3 by a sixth distance T6 in a downward direction normal to the top surface EL1c. As an example, nano dots ND in the sixth pattern NDP6 may be provided to have substantially the same shape and arrangement as the nano dots ND in the third pattern NDP3. As another example, the nano dots ND of the sixth pattern NDP6 may be larger or smaller than the nano dots ND of the third pattern NDP3, and a distance between the nano dots ND arranged in the sixth pattern NDP6 may be larger or smaller than a distance between the nano dots ND arranged in the third pattern NDP3 (not shown).

The fourth to sixth distances T4, T5, and T6 may be equal to or smaller than the first to third distances T1, T2, and T3, respectively. The fourth distance T4 may be substantially equal to the sixth distance T6. The fifth distance T5 may be larger than or equal to the first distance T1.

FIGS. 10A to 17B illustrate stages in a method of fabricating a semiconductor device according to an embodiment. In detail, FIGS. 10A, 11A, 12A, 13A, 14A, 15A, 16A, and 17A are sectional views along line I-I' of FIG. 5, and FIGS. 10B, 11B, 12B, 13B, 14B, 15B, 16B, and 17B are sectional views along line of FIG. 5. FIGS. 18 to 21 are diagrams illustrating a process of forming the first and second electrodes EL1 and EL2 in FIGS. 17A and 17B.

Figure 10A:
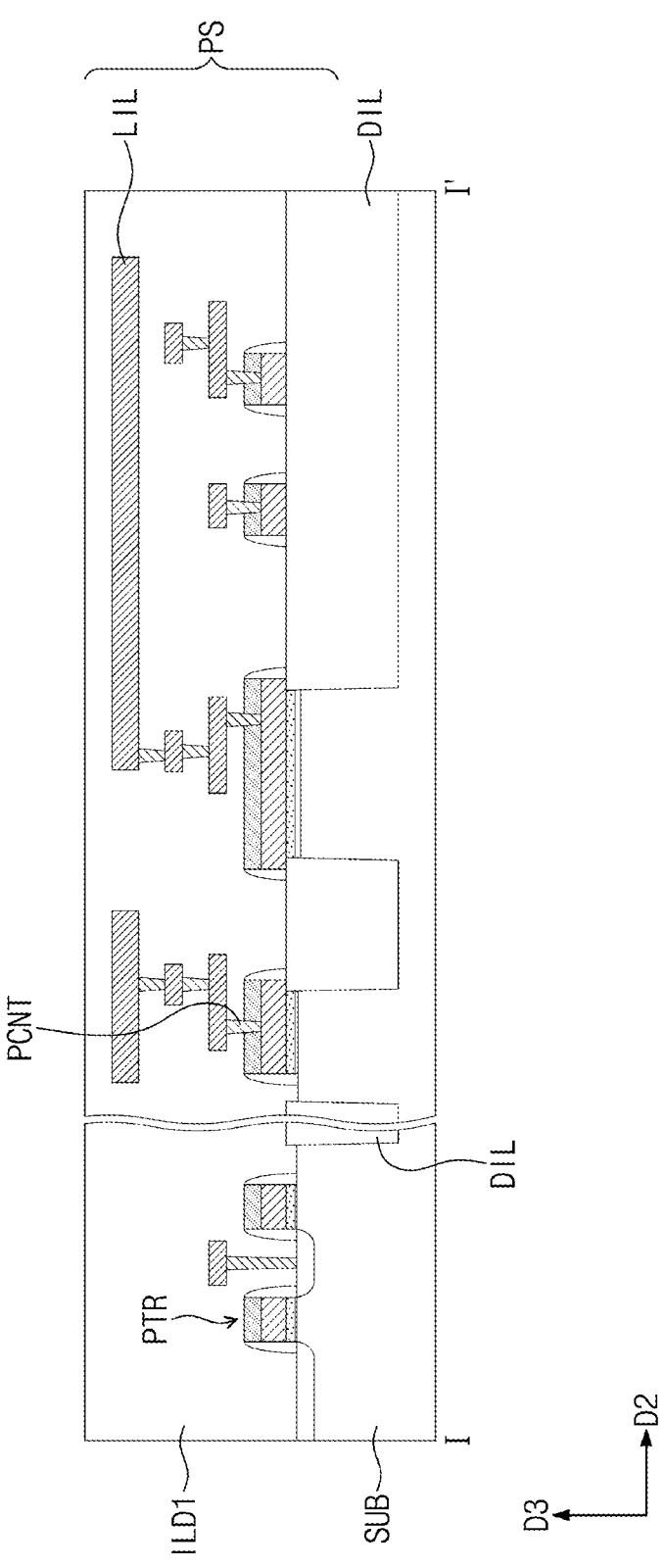
Figure 10B:
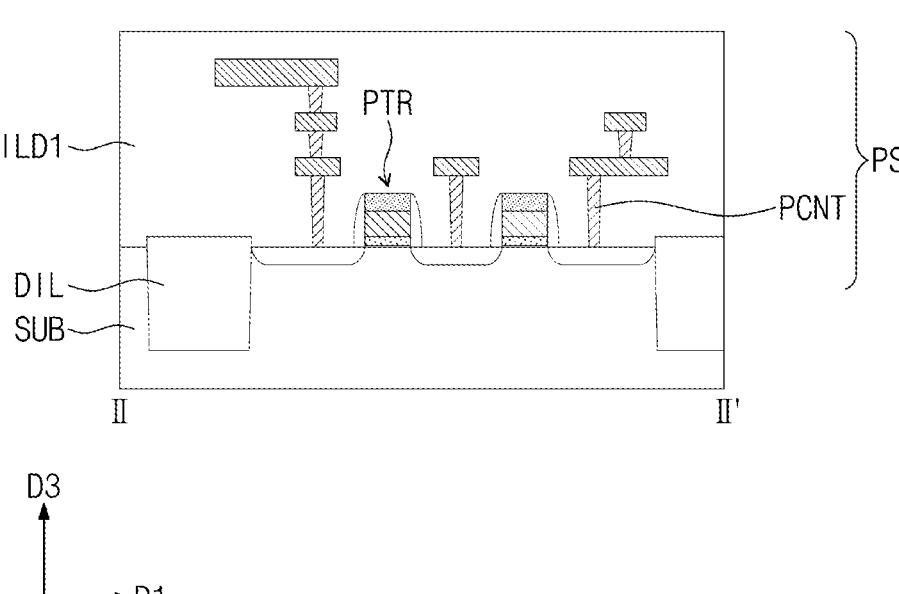
FIGS. 10B, 11B, 12B, 13B, 14B, 15B, 16B, and 17B are sectional views along line II-II' of FIG. 5 of stages in a method of fabricating a semiconductor device according to an embodiment.

Referring to FIGS. 5, 10A, and 10B, the peripheral circuit structure PS may be formed on the first substrate SUB. The formation of peripheral circuit structure PS may include forming the peripheral transistors PTR on the first substrate SUB and forming the lower interconnection lines LIL on the peripheral transistors PTR. For example, the formation of the peripheral transistors PTR may include forming the device isolation layer DIL on the first substrate SUB to define active regions, forming a gate insulating layer and a gate electrode on the active regions, and injecting impurities into the active regions to form a source/drain region. The first interlayer insulating layer ILD1 may be formed to cover the peripheral transistors PTR and the lower interconnection lines LIL.

Figure 11A:
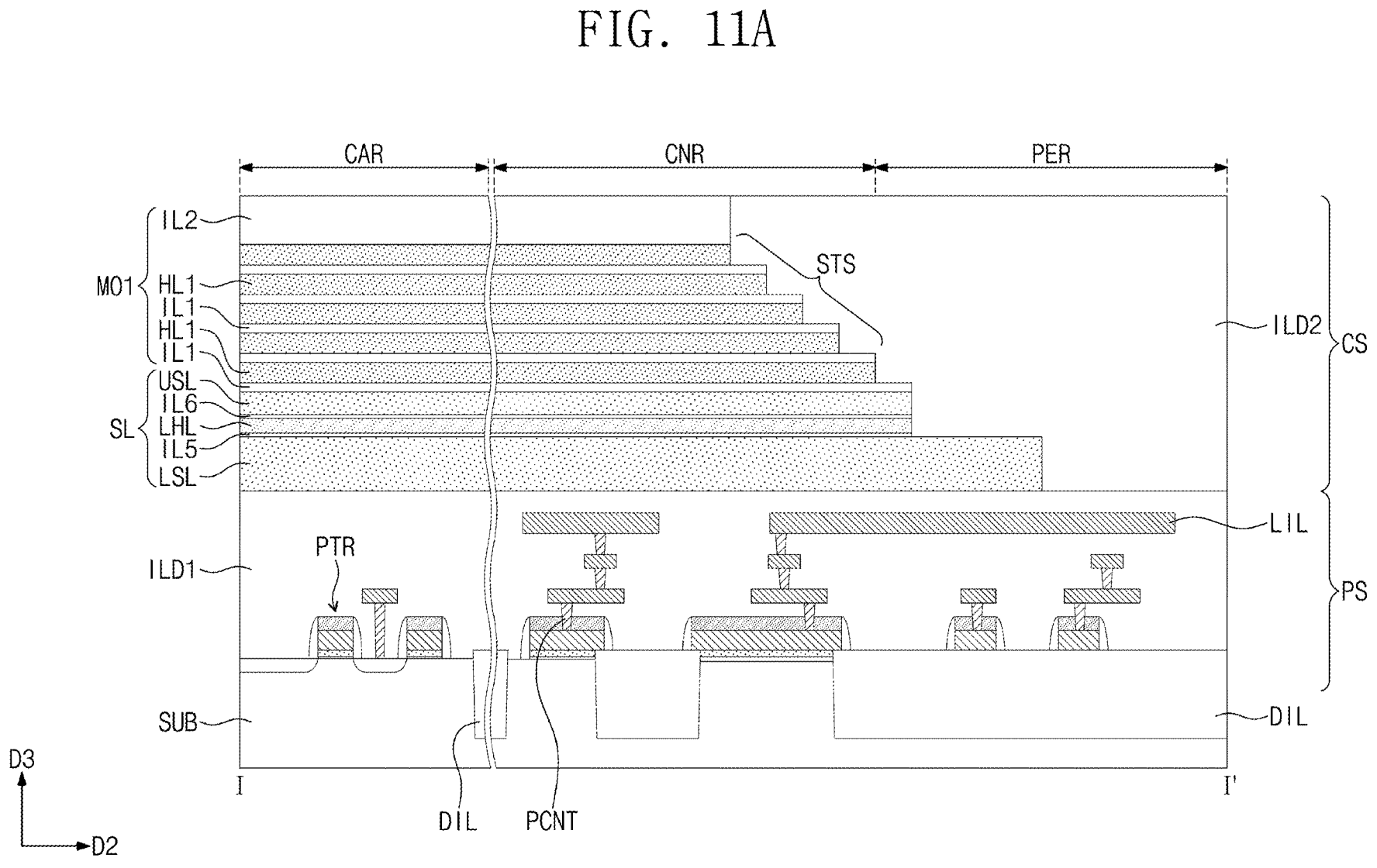
Figure 11B:
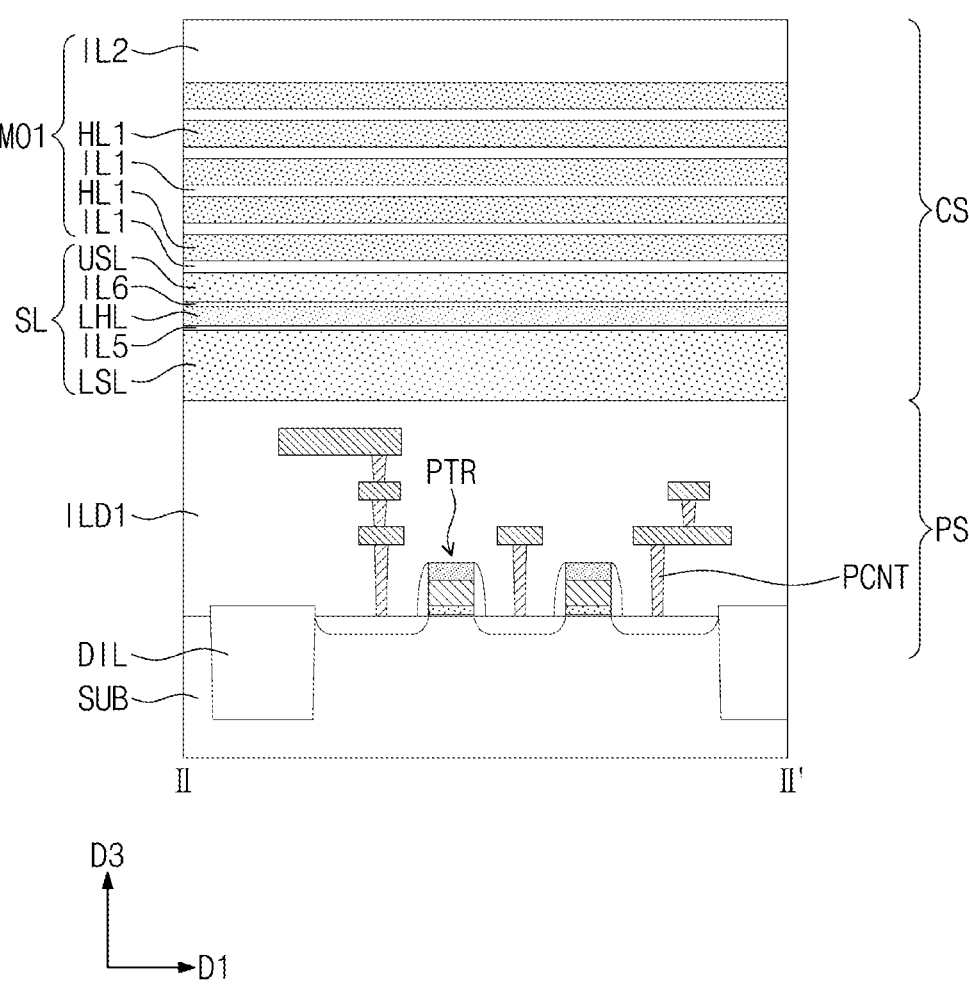

Referring to FIGS. 5, 11A, and 11B, the upper level layer CS including the cell array region CAR, the cell contact region CNR, and the peripheral region PER may be formed on the first interlayer insulating layer ILD1. In detail, the second substrate SL may be formed on the first interlayer insulating layer ILD1. The formation of the second substrate SL may include sequentially forming the lower semiconductor layer LSL, the fifth insulating layer IL5, the lower sacrificial layer LHL, the sixth insulating layer IL6, and the upper semiconductor layer USL. For example, the lower semiconductor layer LSL and the upper semiconductor layer USL may be formed of or include a semiconductor material (e.g., polysilicon). For example, the fifth and sixth insulating layers IL5 and IL6 may be formed of or include silicon oxide, and the lower sacrificial layer LHL may be formed of or include silicon nitride or silicon oxynitride.

A first mold structure MO1 may be formed on the second substrate SL. In detail, the first mold structure MO1 may be formed by alternately depositing the first insulating layers IL1 and first sacrificial layers HL1 on the upper semiconductor layer USL. The second insulating layer IL2 may be formed as the uppermost layer of the first mold structure MO1.

The first insulating layers IL1, the first sacrificial layers HL1, and the second insulating layer IL2 may be deposited using, e.g., a thermal chemical vapor deposition (thermal CVD) process, a plasma-enhanced chemical vapor deposition (Plasma enhanced CVD) process, a physical chemical vapor deposition (physical CVD) process, or an atomic layer deposition (ALD) process. For example, the first insulating layers IL1 and the second insulating layer IL2 may be formed of or include silicon oxide, and the first sacrificial layers HL1 may be formed of or include silicon nitride or silicon oxynitride.

The staircase structure STS may be formed in the first mold structure MO1 on the cell contact region CNR. In detail, a cycle process may be performed on the first mold structure MO1 to form the staircase structure STS on the cell contact region CNR. The formation of the staircase structure STS may include forming a mask pattern (not shown) on the first mold structure MO1 and performing a cyclic patterning process using the mask pattern several times. The cyclic patterning process may include a step of etching a portion of the first mold structure MO1 using the mask pattern as an etch mask and a trimming step of reducing a size of the mask pattern.

The second interlayer insulating layer ILD2 may be formed on the first mold structure MO1. The formation of the second interlayer insulating layer ILD2 may include forming an insulating layer to cover the first mold structure MO1 and performing a planarization process on the insulating layer to expose the second insulating layer IL2.

Figure 12A:
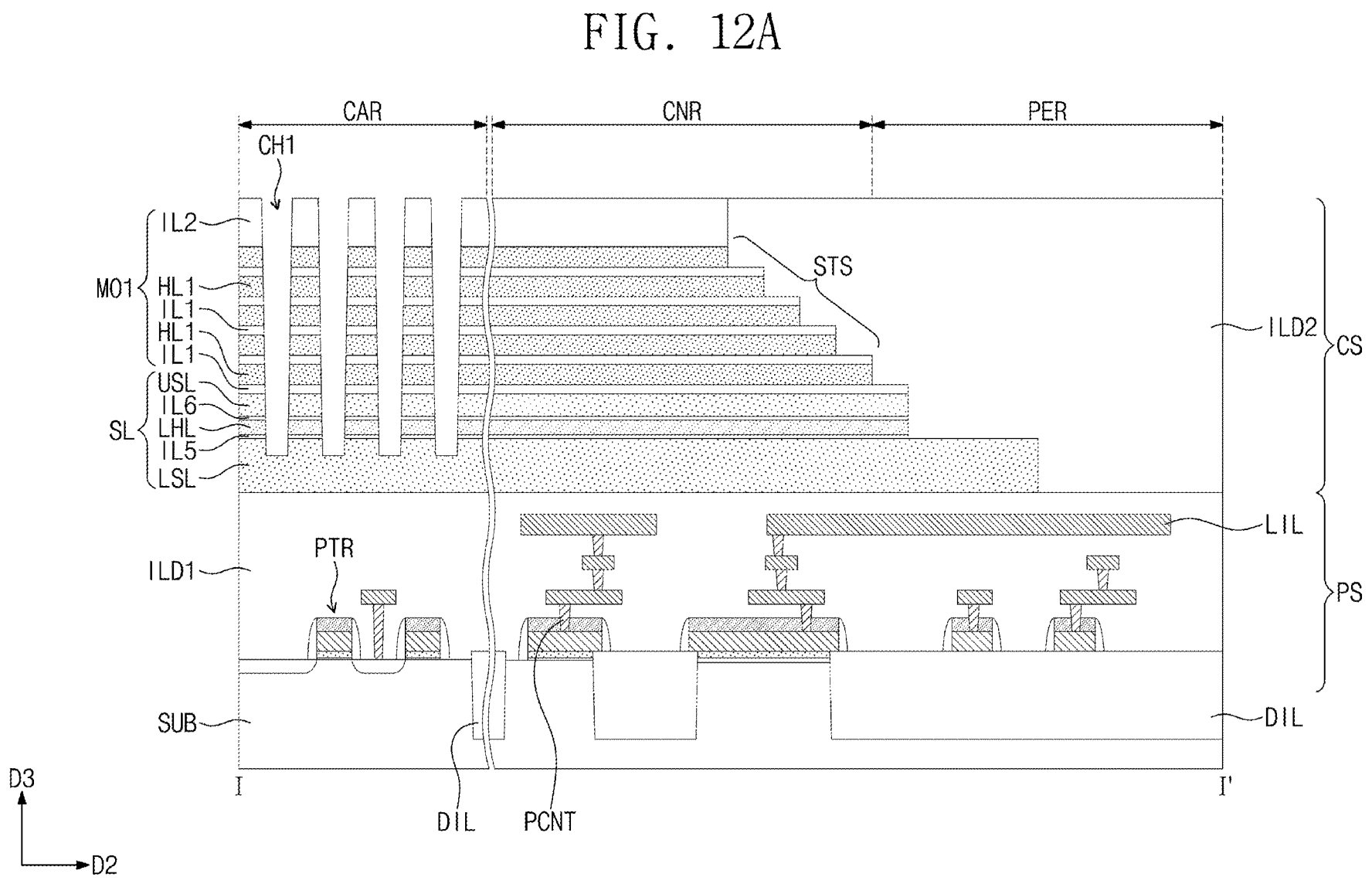
Figure 12B:
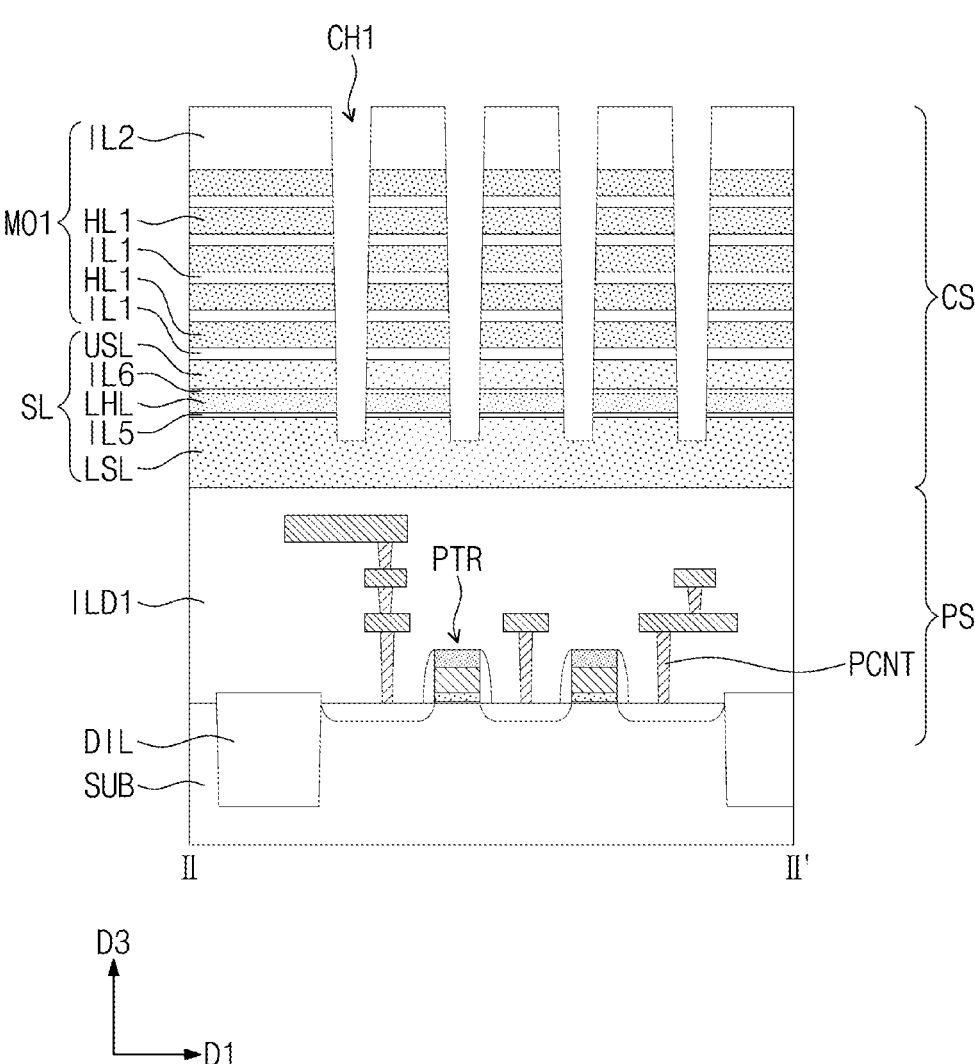

Referring to FIGS. 5, 12A, and 12B, first channel holes CH1 may be formed on the cell array region CAR to penetrate the first mold structure MO1. Each of the first channel holes CH1 may be formed to expose the lower semiconductor layer LSL.

In detail, the formation of the first channel holes CH1 may include forming a mask pattern (not shown), in which openings defining regions for the first channel holes CH1 are provided, on the first mold structure MO1, and anisotropically etching the first mold structure MO1 using the mask pattern as an etch mask. The anisotropic etching process may include, e.g., a plasma etching process, a reactive ion etching (RIE) process, inductively-coupled plasma reactive ion etching (ICP-RIE) process, or an ion beam etching (IBE) process.

According to an embodiment, a patterning process for forming the first channel holes CH1 may include a lithography process using extreme ultraviolet (EUV) light. In the present specification, the EUV light may have a wavelength ranging from 4 nm to 124 nm, e.g., from 4 nm to 20 nm. For example, the EUV light may have a wavelength of 13.5 nm. The EUV light may have an energy of 6.21 eV to 124 eV, e.g., 90 eV to 95 eV.

The EUV lithography process may include exposing a photoresist layer to extreme ultraviolet (EUV) light and developing the exposed photoresist layer. As an example, the photoresist layer may be an organic photoresist layer containing an organic polymer (e.g., polyhydroxystyrene). The organic photoresist layer may further include a photosensitive compound which can be reacted with the EUV light. The organic photoresist layer may further contain a material having high EUV absorptivity (e.g., organometallic materials, iodine-containing materials, or fluorine-containing materials). As another example, the photoresist layer may be an inorganic photoresist layer containing an inorganic material (e.g., tin oxide).

The photoresist layer may be formed to have a relatively small thickness. Photoresist patterns may be formed by developing the photoresist layer, which is exposed to the EUV light. When viewed in a plan view, the photoresist patterns may be formed to have, e.g., a line shape extending in a specific direction, an island shape, a zigzag shape, a honeycomb shape, or a circular shape.

Mask patterns may be formed by patterning one or more mask layers, which are disposed below the photoresist patterns, using the photoresist patterns as an etch mask. Desired patterns may be formed on a wafer by patterning a target layer using the mask patterns as an etch mask.

In a comparative example, a multi-patterning technology (MPT) using two or more photomasks is required to form fine-pitch patterns on the wafer. By contrast, in the case where the EUV lithography process according to an embodiment is performed, it may be possible to form the first channel holes CH1 with a fine pitch by using just one photomask.

For example, in the case where the first channel holes CH1 are formed by the EUV lithography process according to the present embodiment, the minimum pitch between the first channel holes CH1 may be less than 45 nm. In other words, by using the EUV lithography process, it may be possible to precisely and finely form the first channel holes CH1, without a multi-patterning technology.

Figure 13A:
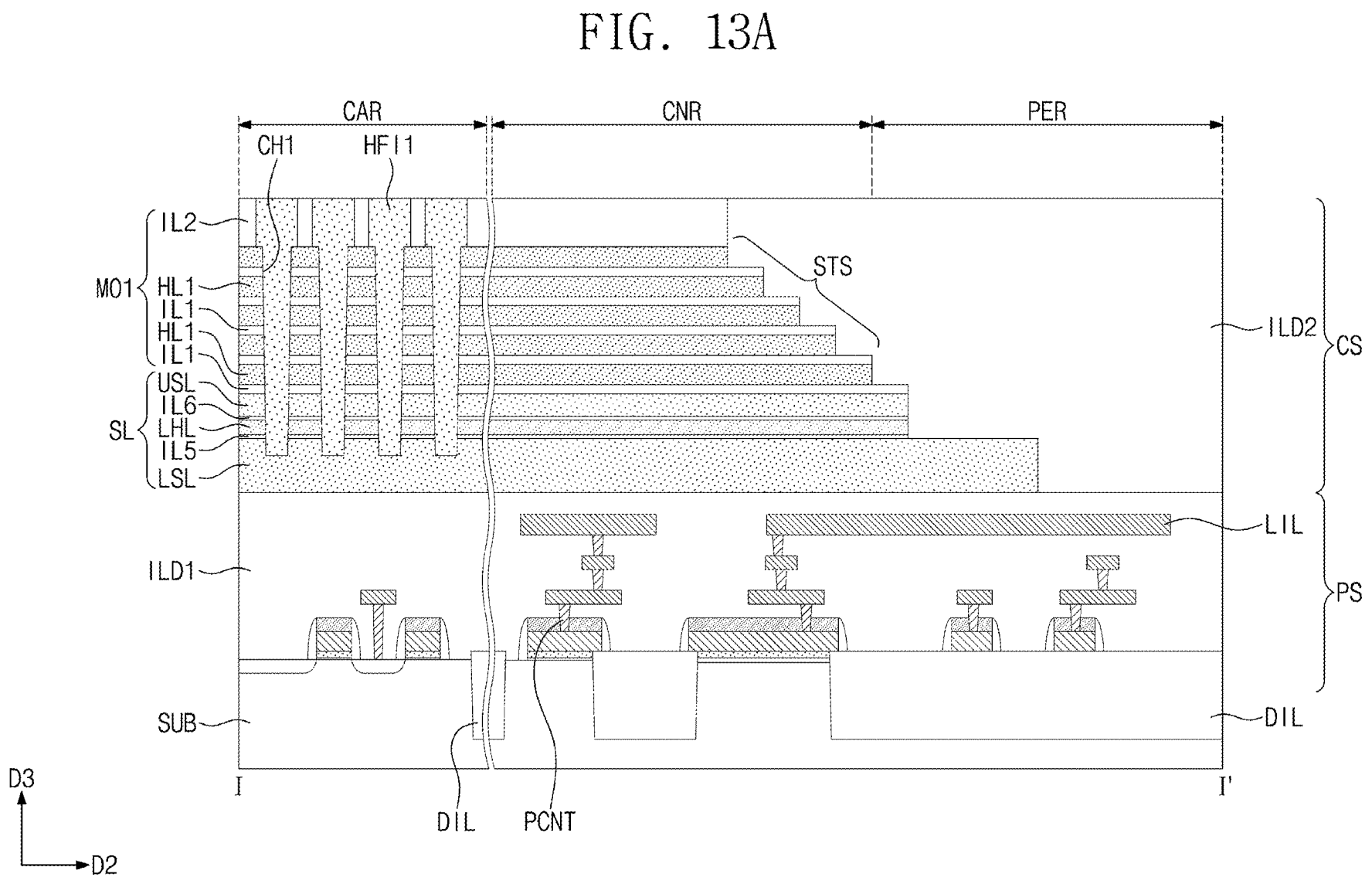
Figure 13B:
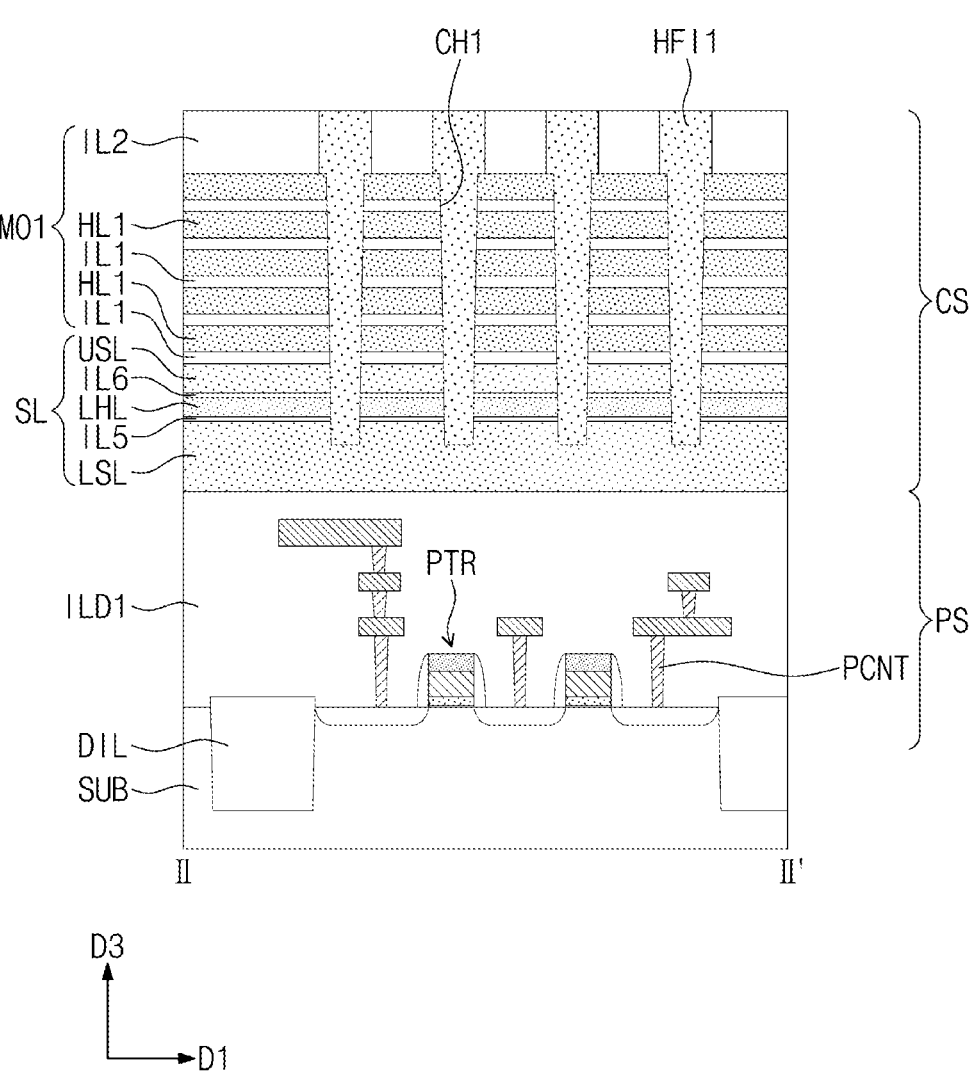

Referring to FIGS. 5, 13A, and 13B, an upper portion of each of the first channel holes CH1 may be expanded. Accordingly, a diameter of the first channel hole CH1 in the second insulating layer IL2 may be abruptly increased.

First sacrificial pillars HFI1 may be formed to fill the first channel holes CH1, respectively. In detail, the formation of the first sacrificial pillars HFI1 may include forming a first sacrificial mask layer to fill the first channel holes CH1 and planarizing the first sacrificial mask layer to expose a top surface of the second insulating layer IL2. For example, the first sacrificial mask layer may be formed of or include polysilicon.

Figure 14A:
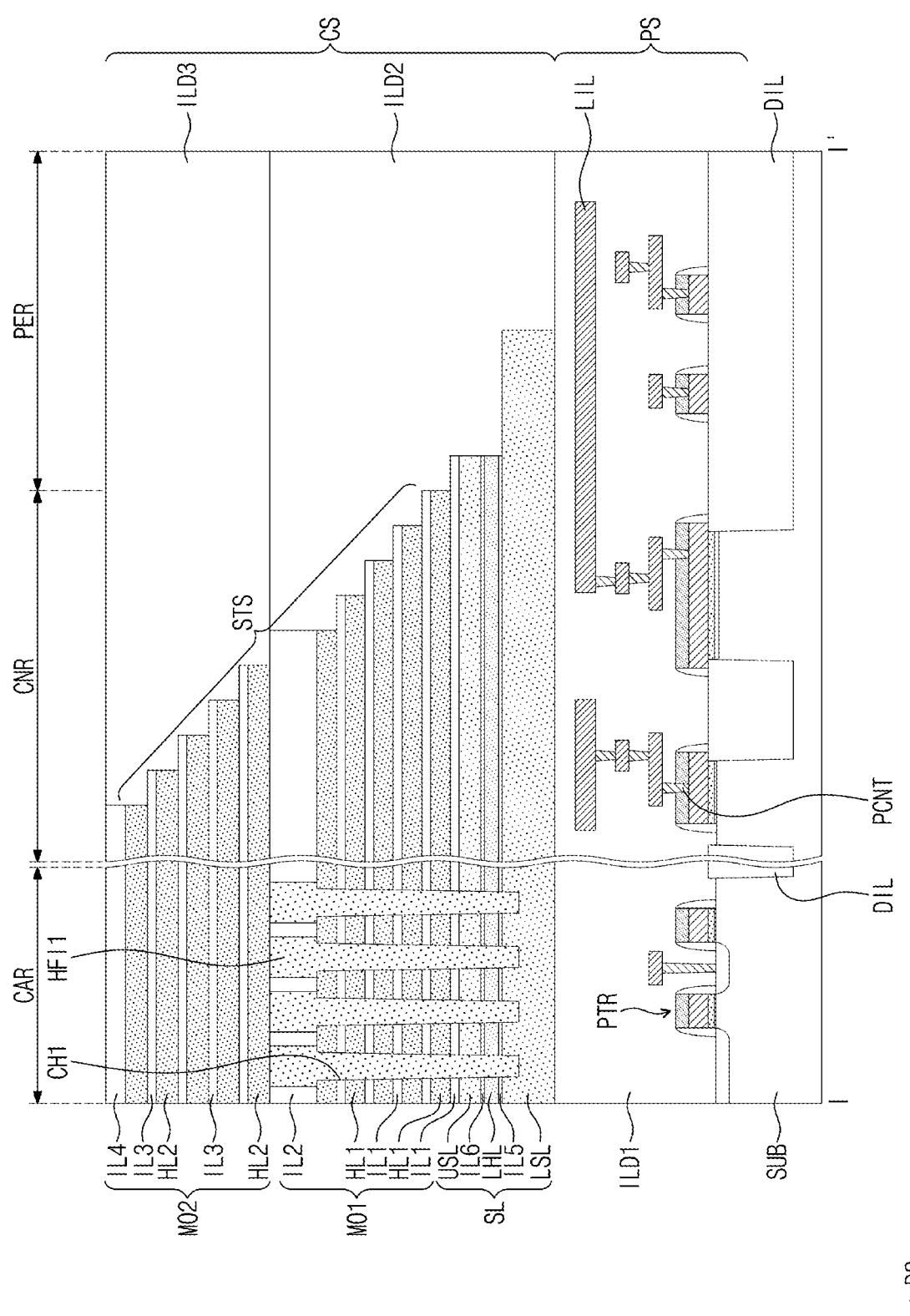
Figure 14B:
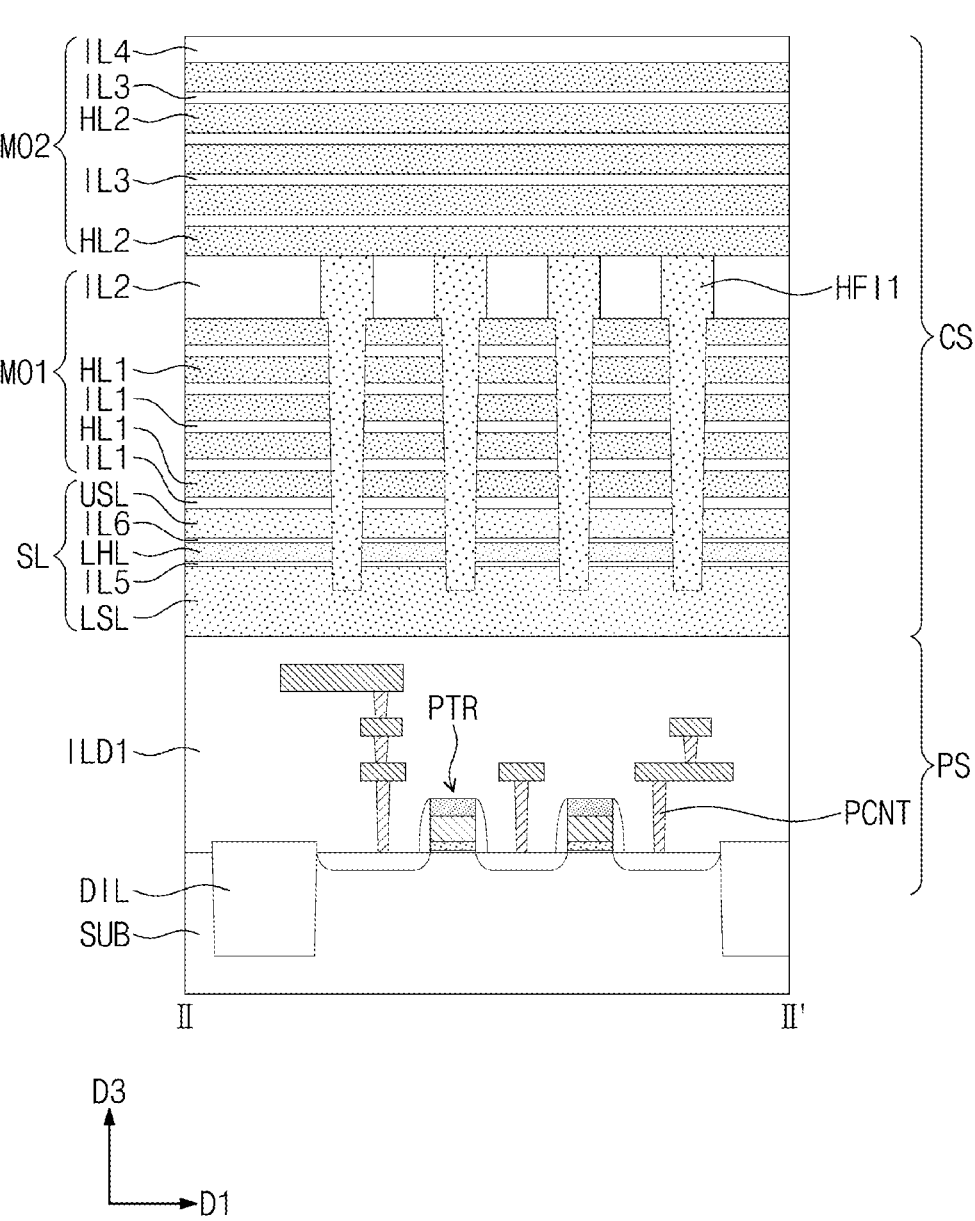

Referring to FIGS. 5, 14A, and 14B, a second mold structure MO2 may be formed on the first mold structure MO1 of the cell array region CAR. The formation of the second mold structure MO2 may include alternately stacking the third insulating layers IL3 and second sacrificial layers HL2 on the first mold structure MO1 to form a stack and performing a cyclic process on the stack, which is composed of the third insulating layers IL3 and the second sacrificial layers HL2, to form the staircase structure STS. The cyclic process may be performed in the same manner as the process for forming the staircase structure STS of the first mold structure MO1.

The second mold structure MO2 may have the staircase structure STS. The staircase structure STS of the second mold structure MO2 may be connected to the staircase structure STS of the first mold structure MO1.

The fourth insulating layer IL4 may be formed as the uppermost layer of the second mold structure MO2. For example, the third insulating layers IL3 and the fourth insulating layer IL4 may include a silicon oxide layer, and the second sacrificial layers HL2 may include a silicon nitride layer or a silicon oxynitride layer. The second sacrificial layers HL2 may be formed of or include the same material as the first sacrificial layers HL1.

The third interlayer insulating layer ILD3 may be formed on the second mold structure MO2. The formation of the third interlayer insulating layer ILD3 may include forming an insulating layer to cover the second mold structure MO2 and performing a planarization process on the insulating layer to expose the fourth insulating layer IL4. The third interlayer insulating layer ILD3 may cover the staircase structure STS of the second mold structure MO2.

Figure 15A:
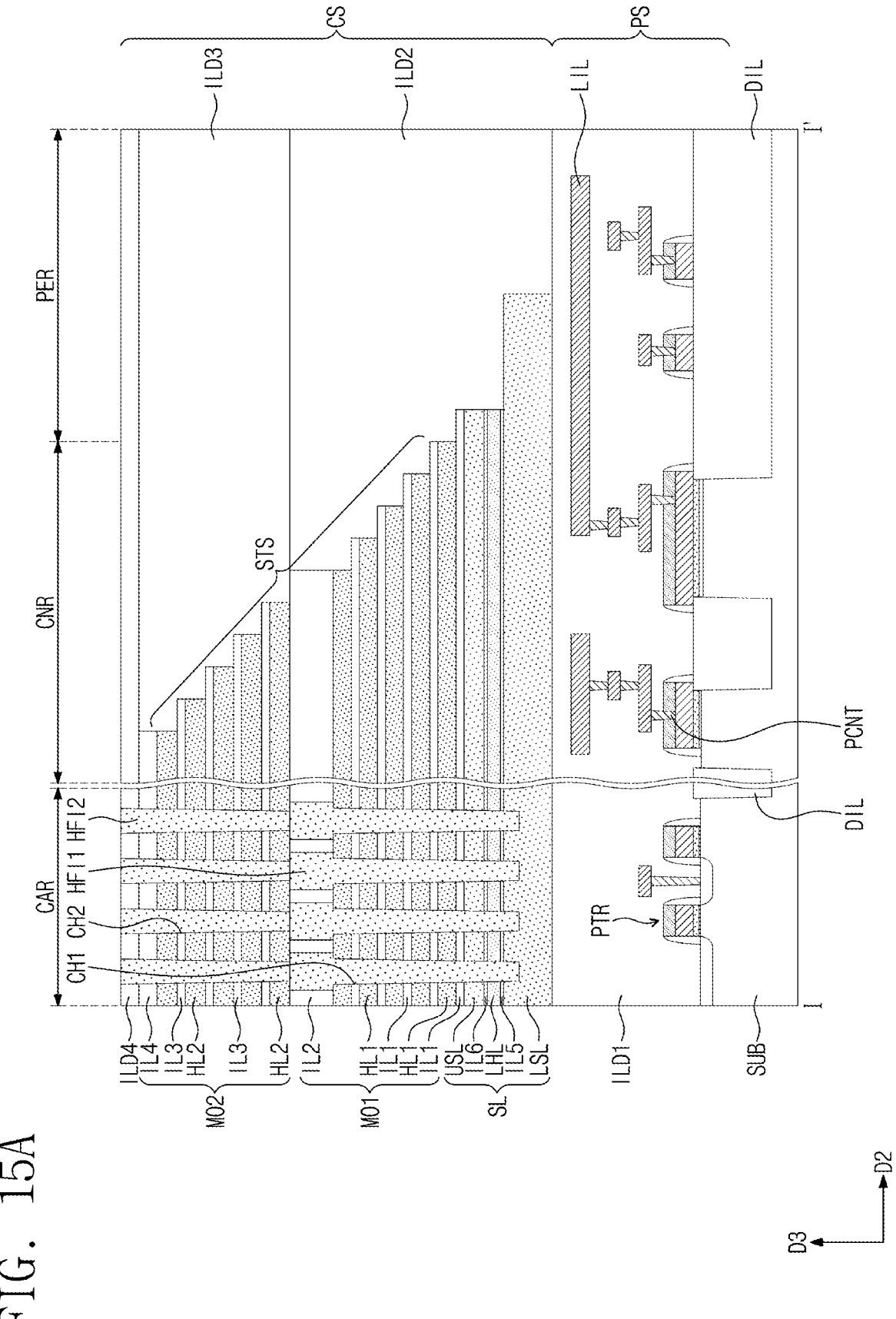
Figure 15B:
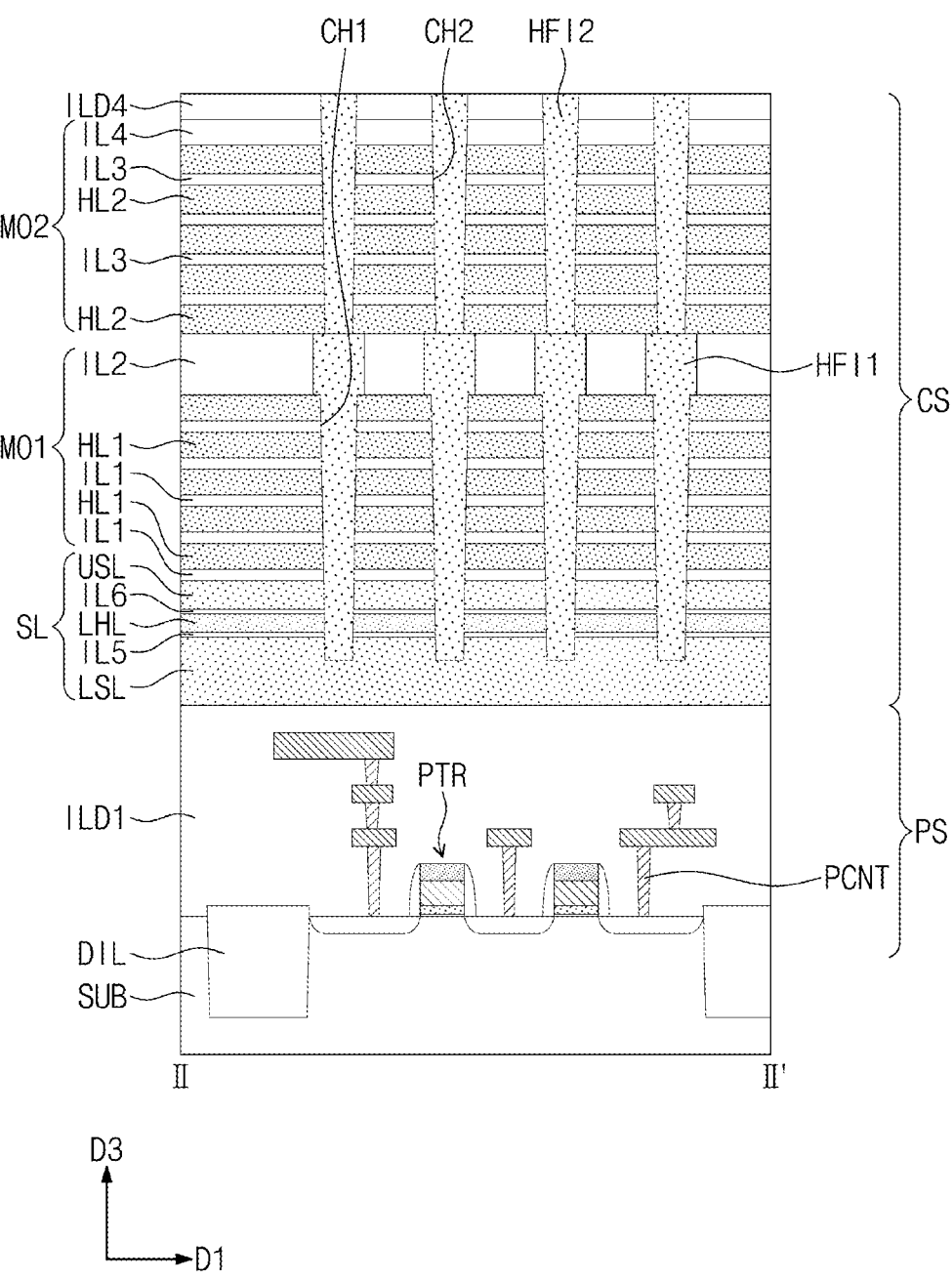

Referring to FIGS. 5, 15A, and 15B, the fourth interlayer insulating layer ILD4 may be formed on a top surface of the first substrate SUB. Second channel holes CH2 may be formed to penetrate the second mold structure MO2 of the cell array region CAR. The second channel holes CH2 may be formed to be vertically overlapped with the first sacrificial pillars HFI1, respectively.

The second channel holes CH2 may be formed using a photolithography process. In detail, the formation of the second channel holes CH2 may include forming a photoresist pattern (and a mask pattern thereunder), in which openings defining regions for the second channel holes CH2 are defined, using a photolithography process, and performing an anisotropic etching process using the photoresist pattern as an etch mask. Except for this, a process of forming the second channel holes CH2 may be performed in substantially the same manner as that for forming the first channel holes CH1.

Second sacrificial pillars HFI2 may be formed to fill the second channel holes CH2, respectively. The second sacrificial pillars HFI2 may be vertically overlapped with the first sacrificial pillars HFI1, respectively. In detail, the formation of the second sacrificial pillars HFI2 may include forming a second sacrificial mask layer to fill the second channel holes CH2 and planarizing the second sacrificial mask layer to expose the top surface of the fourth interlayer insulating layer ILD4. For example, the second sacrificial mask layer may be formed of or include polysilicon. The second sacrificial pillars HFI2 may be formed of or include the same material as the first sacrificial pillars HFI1.

Figure 16A:
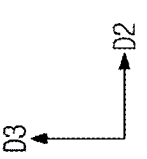
Figure 16B:
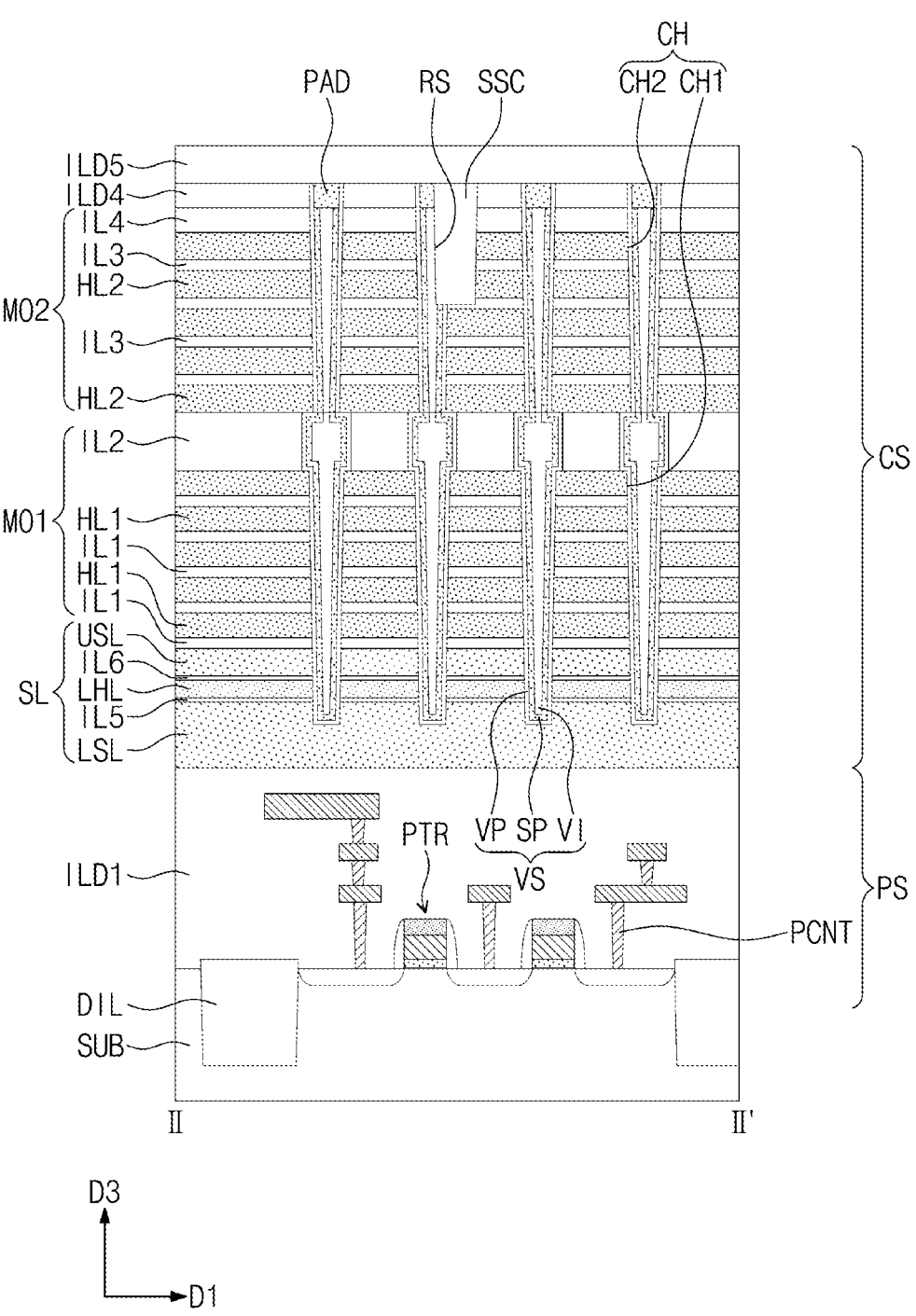

Referring to FIGS. 5, 16A, and 16B, the first and second sacrificial pillars HFI1 and HFI2 may be selectively removed from the first and second channel holes CH1 and CH2. The first and second channel holes CH1 and CH2, from which the first and second sacrificial pillars HFI1 and HFI2 are removed, may be connected to each other to form a single channel hole CH.

The vertical channel structures VS may be formed in the channel holes CH, respectively. The formation of the vertical channel structure VS may include sequentially forming the vertical insulating pattern VP, the vertical semiconductor pattern SP, and the insulating gapfill pattern VI on an inner surface of the channel hole CH. The vertical insulating pattern VP and the vertical semiconductor pattern SP may be conformally formed. The conductive pad PAD may be formed in an upper portion of each of the vertical channel structures VS.

The recess RS defining the cutting structure SSC may be formed in an upper portion of the second mold structure MO2. The recess RS may be formed to penetrate two uppermost ones of the second sacrificial layers HL2 of the second mold structure MO2. The recess RS may also be formed to partially penetrate an upper portion of the vertical channel structure VS overlapped with the same. The cutting structure SSC may be formed in the recess RS. For example, the cutting structure SSC may include a silicon oxide layer. The fifth interlayer insulating layer ILD5 may be formed on the fourth interlayer insulating layer ILD4 to cover the conductive pads PAD and the cutting structure SSC.

Figure 17A:
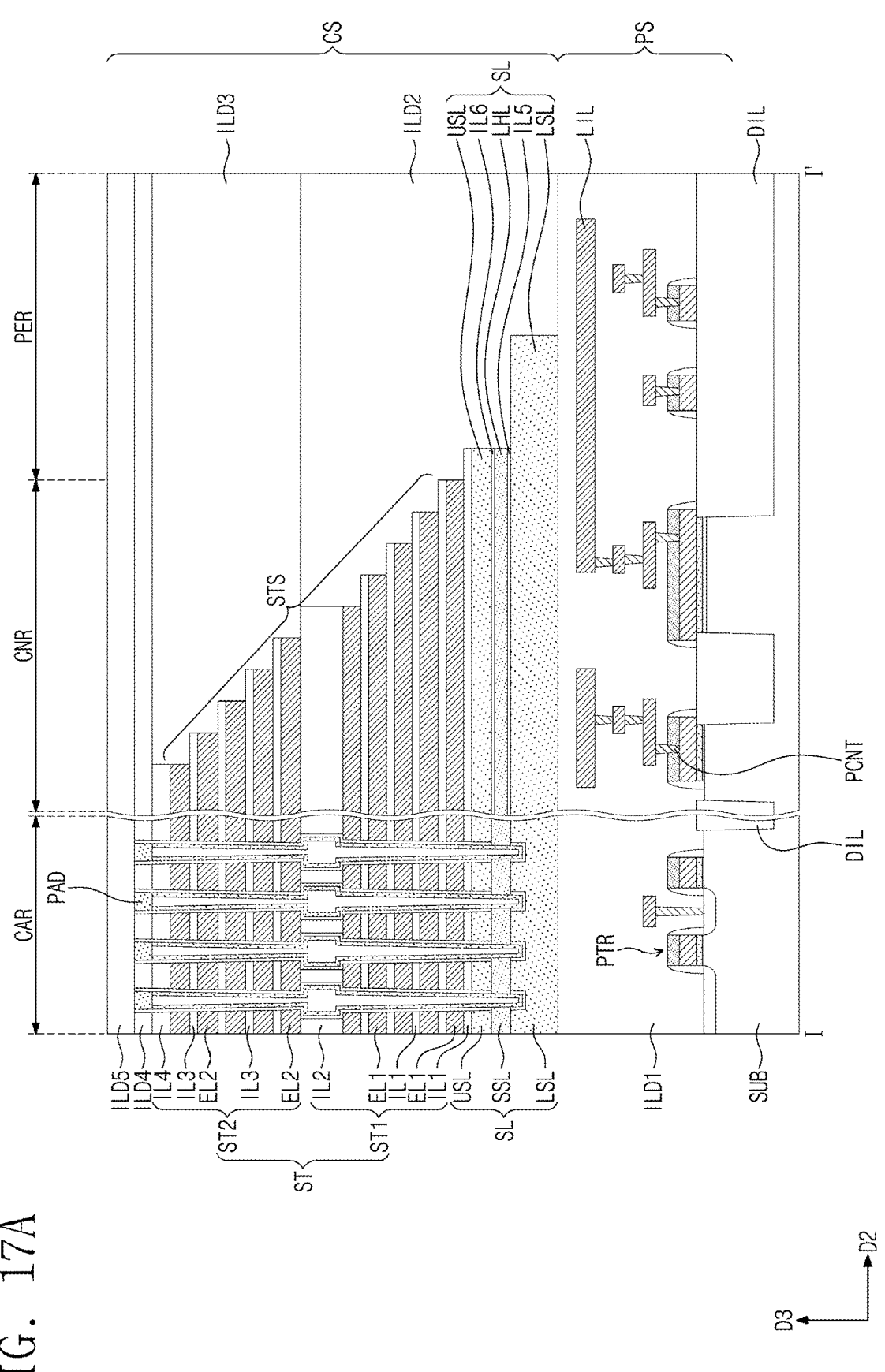
Figure 17B:
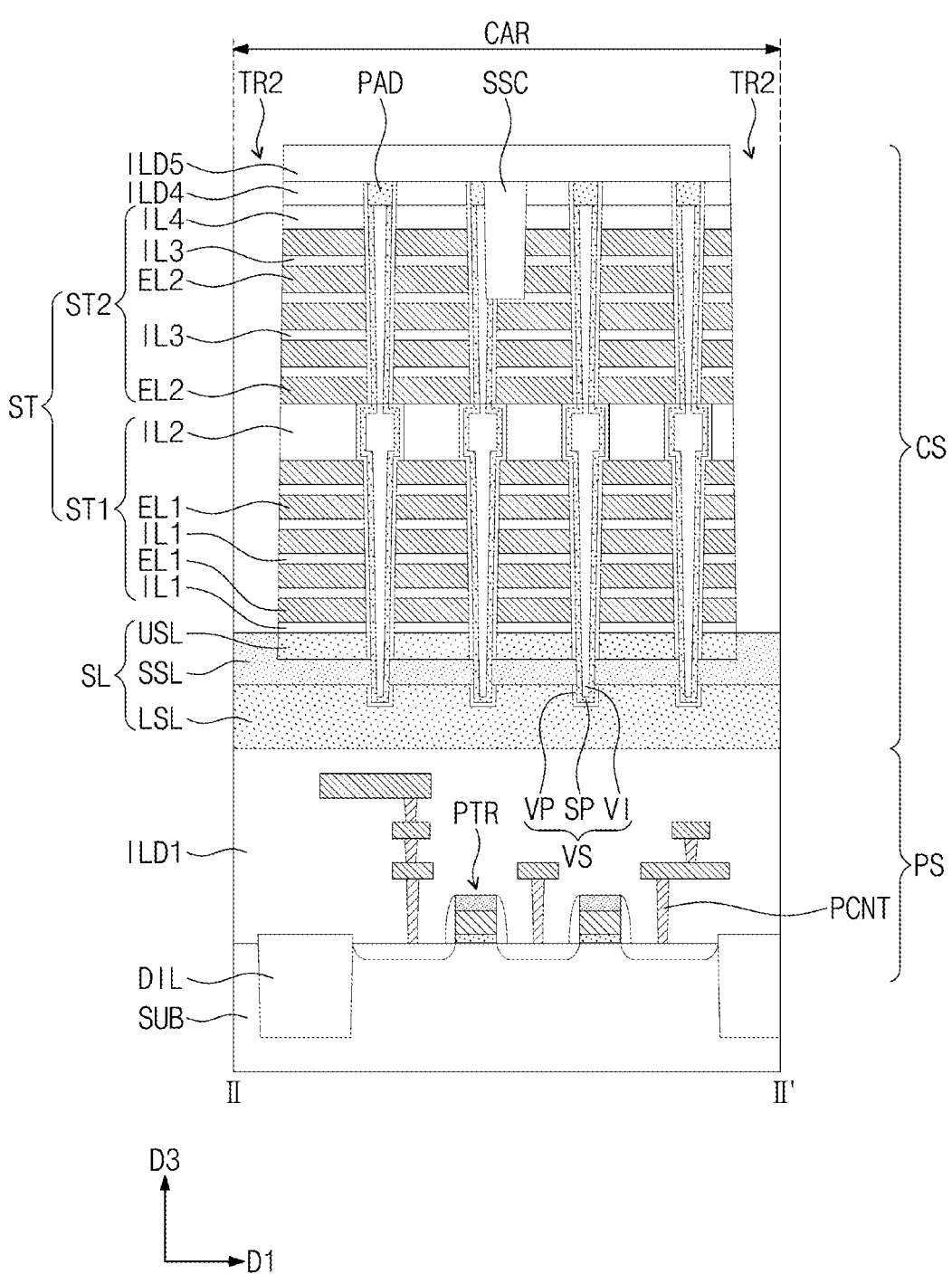

Referring to FIGS. 5, 17A, and 17B, the first and second mold structures MO1 and MO2 on the cell array region CAR may be patterned to form second trenches TR2 penetrating them. The second trenches TR2 may be formed to define the separation structures SPS.

The second trench TR2 may be formed to expose the lower semiconductor layer LSL. The second trench TR2 may be formed to expose side surfaces of the first and second sacrificial layers HL1 and HL2. The second trench TR2 may expose the side surface of the fifth insulating layer IL5, the side surface of the lower sacrificial layer LHL, and the side surface of the sixth insulating layer IL6.

In the cell array region CAR, the lower sacrificial layer LHL exposed by the second trenches TR2 may be replaced with the source semiconductor layer SSL. In detail, the lower sacrificial layer LHL exposed by the second trenches TR2 may be selectively removed. As a result of the removal of the lower sacrificial layer LHL, a lower portion of the vertical insulating pattern VP of each of the vertical channel structures VS may be exposed.

The exposed lower portion of the vertical insulating pattern VP may be selectively removed. Accordingly, a lower portion of the vertical semiconductor pattern SP may be exposed. The fifth insulating layer IL5 and the sixth insulating layer IL6 may be removed during removing the lower portion of the vertical insulating pattern VP.

The source semiconductor layer SSL may be formed in a space from which the fifth insulating layer IL5, the lower sacrificial layer LHL, and the sixth insulating layer IL6 are removed. The source semiconductor layer SSL may be in direct contact with the exposed lower portion of the vertical semiconductor pattern SP. The source semiconductor layer SSL may be in direct contact with the lower semiconductor layer LSL therebelow. The source semiconductor layer SSL may be in direct contact with the upper semiconductor layer USL thereon. The lower semiconductor layer LSL, the source semiconductor layer SSL, and the upper semiconductor layer USL in the cell array region CAR may constitute the second substrate SL.

In the cell array region CAR, the first and second sacrificial layers HL1 and HL2 exposed by the second trenches TR2 may be replaced with the first and second electrodes EL1 and EL2 to form the cell array structure ST. In detail, the first and second sacrificial layers HL1 and HL2 exposed through the second trenches TR2 may be selectively removed. The first and second electrodes EL1 and EL2 may be formed in empty spaces, respectively, which are formed by the removing of the first and second sacrificial layers HL1 and HL2. Hereinafter, as an example of a process of forming the first and second electrodes EL1 and EL2, the formation of the first electrode EL1 will be described in more detail with reference to FIGS. 18 to 21.

Figure 18:
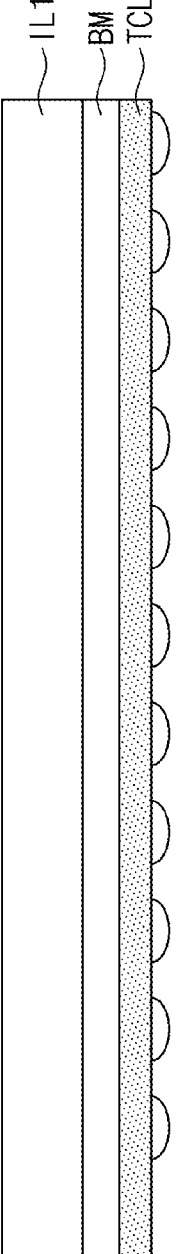
FIGS. 18 to 21 are diagrams concretely illustrating a process of forming first and second electrodes in FIGS. 17A and 17B.
Figure 18:
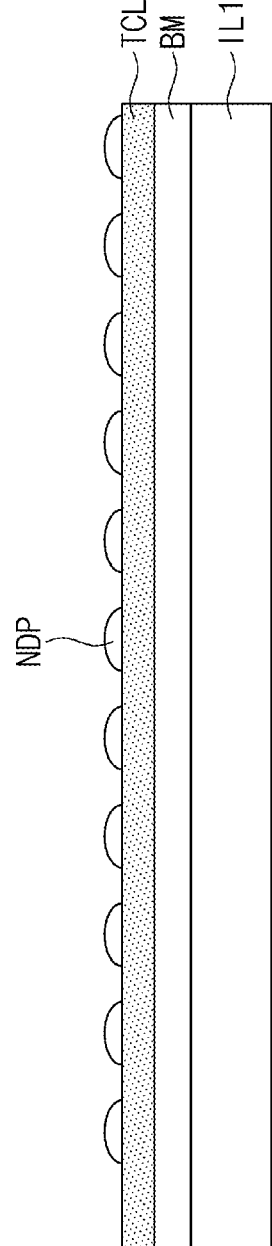

Referring to FIG. 18, the electrode insulating layer BM may be formed on the first insulating layer IL1 through an empty space formed by removing the first sacrificial layers HL1. For example, when the first sacrificial layers HL1 are removed, empty spaces are formed between vertically adjacent ones of the first insulating layers IL1, and the electrode insulating layer BM may be formed conformally in the resultant empty space along facing surfaces of the vertically adjacent ones of the first insulating layers IL1 and along the vertical channel structure VS. That is, the electrode insulating layer BM may be formed to cover the first insulating layer IL1 and a portion of a side surface of the vertical channel structure VS, which are exposed through the empty space.

Next, an amorphous layer TCL may be formed on an exposed surface of the electrode insulating layer BM. The amorphous layer TCL may be formed of or include tungsten nitride (WN).

The nano dot pattern NDP may be formed on the amorphous layer TCL, e.g., so the amorphous layer TCL is between the electrode insulating layer BM and the nano dot pattern NDP. The nano dot pattern NDP may be deposited using, e.g., a thermal chemical vapor deposition (thermal CVD) process, a plasma-enhanced chemical vapor deposition (Plasma enhanced CVD) process, a physical chemical vapor deposition (physical CVD) process, or an atomic layer deposition (ALD) process.

Figure 19:
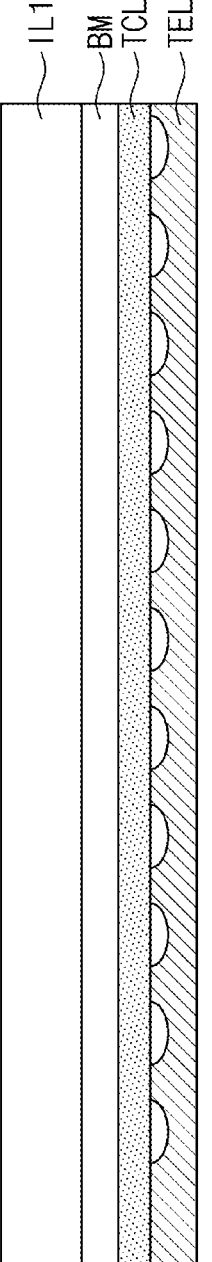
Figure 19:
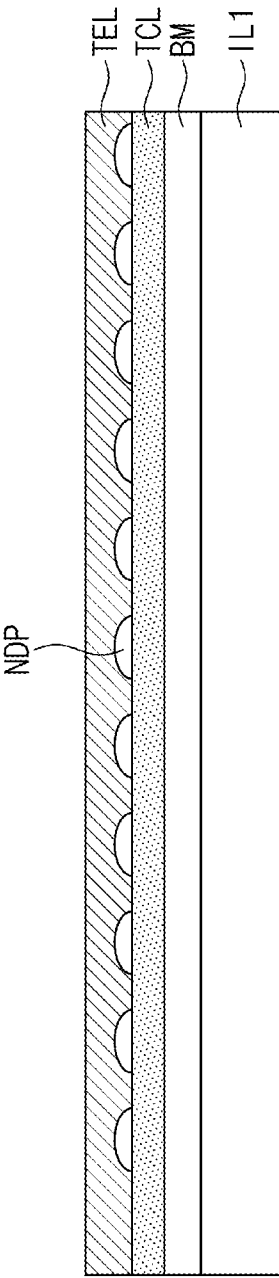

Referring to FIG. 19, a conductive layer TEL may be formed on the amorphous layer TCL, on which the nano dot pattern NDP is formed. The conductive layer TEL may be provided on the amorphous layer TCL to, e.g., completely, cover the nano dot pattern NDP. The conductive layer TEL may be formed of or include tungsten.

Figure 20:
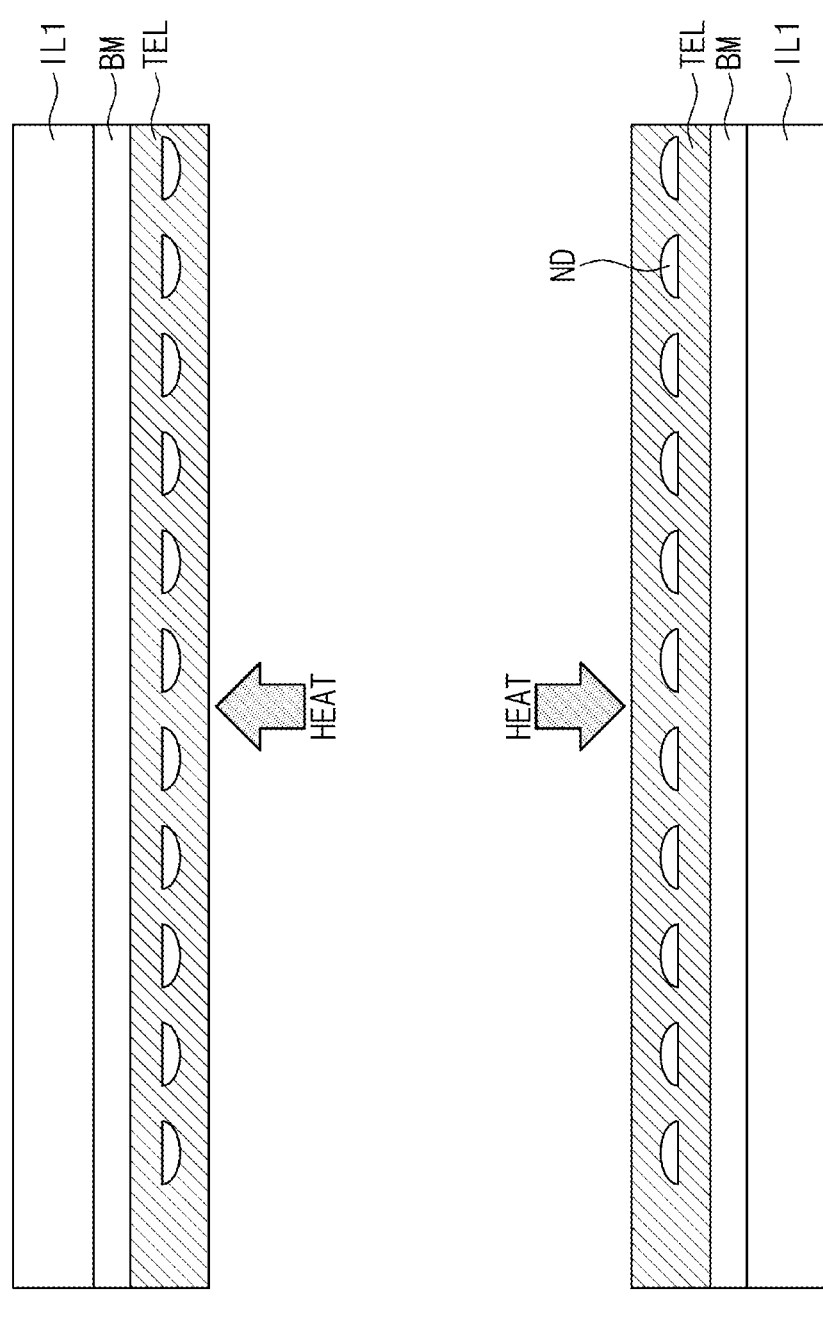

Referring to FIG. 20, heat HEAT may be applied to the conductive layer TEL covering the nano dot pattern NDP. In this case, nitrogen atoms in the tungsten nitride may be diffused to the outside of the amorphous layer TCL, and as a result, the amorphous layer TCL may be formed of a material containing tungsten as its main element. In the case where a nitrogen content of the amorphous layer TCL is lowered by the thermal process, the amorphous layer TCL may have substantially the same physical or chemical structure as the conductive layer TEL.

Figure 21:
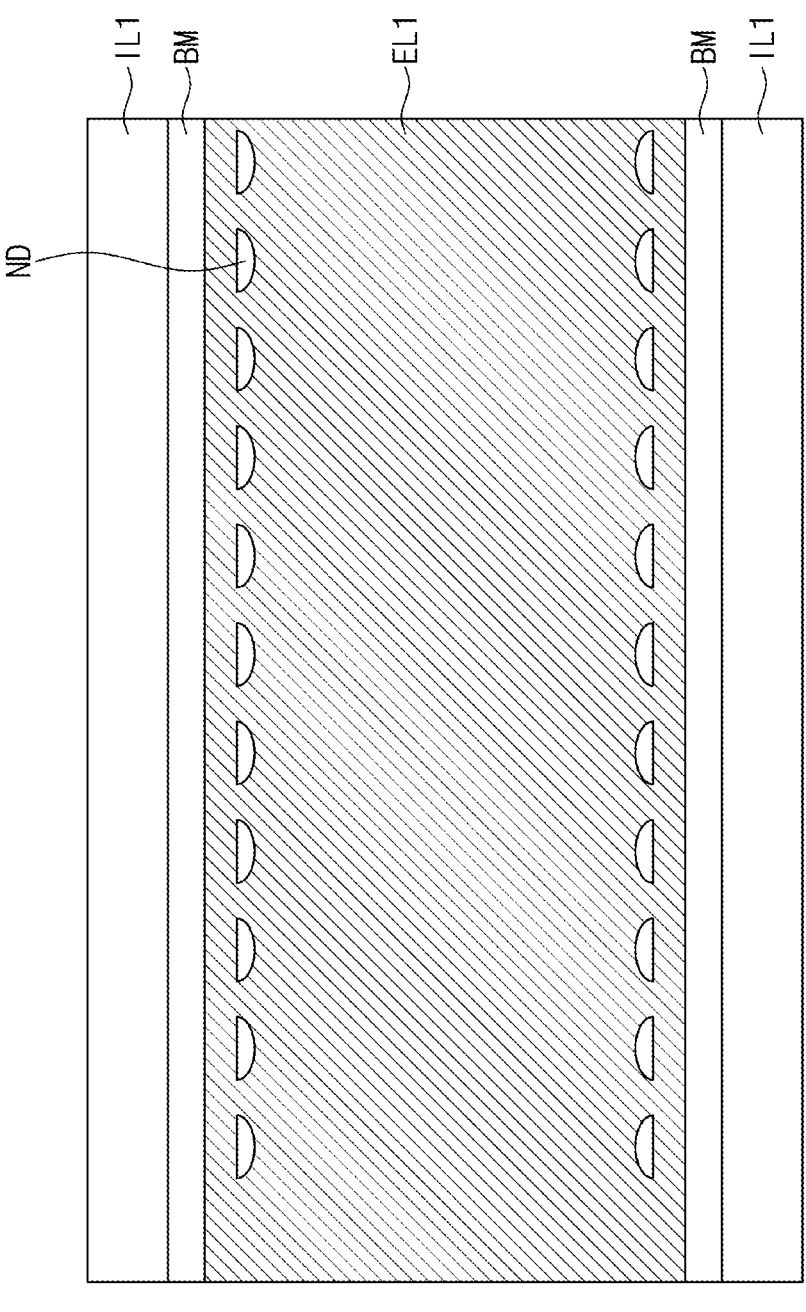

Referring to FIG. 21, a conductive material may be formed to fill an empty space enclosed by the conductive layer TEL. Accordingly, the first electrode EL1 including the nano dot pattern NDP may be formed.

During the removal of the first and second sacrificial layers HL1 and HL2, the first cutting layer SSC1 of the cutting structure SSC may prevent the second cutting layer SSC2 from being etched. Accordingly, the second cutting layer SSC2 may be left as it is.

Referring back to FIGS. 5, 6A, and 6B, the separation structures SPS may be formed to fill the second trenches TR2, respectively. The cell contact plugs CPLG may be formed to be connected to the staircase structure STS of the cell array structure ST. The source contact plug SPLG may be formed to be connected to the lower semiconductor layer LSL. The through via TVS may be formed to be connected to the lower interconnection line LIL of the lower level layer PS.

The bit line contact plugs BPLG may be formed to penetrate the fifth interlayer insulating layer ILD5 and to be coupled to the conductive pads PAD, respectively. At least one of the bit line contact plugs BPLG may be formed to be coupled to the conductive pad PAD, which is in contact with the cutting structure SSC.

The bit lines BL, which are respectively connected to the bit line contact plugs BPLG, may be formed on the fifth interlayer insulating layer ILD5. The first upper interconnection lines UIL1, which are respectively connected to the cell contact plugs CPLG, may be formed on the fifth interlayer insulating layer ILD5. The second upper interconnection line UIL2 and the third upper interconnection line UIL3, which are respectively connected to the source contact plug SPLG and the through via TVS, may be formed on the fifth interlayer insulating layer ILD5.

FIGS. 23 to 26 are diagrams illustrating a method of fabricating a semiconductor device according to an embodiment and corresponding to FIGS. 18 to 21. For the sake of brevity, only features that are different from those previously described with reference to FIGS. 18 to 21 will be mainly described below.

Figure 23:
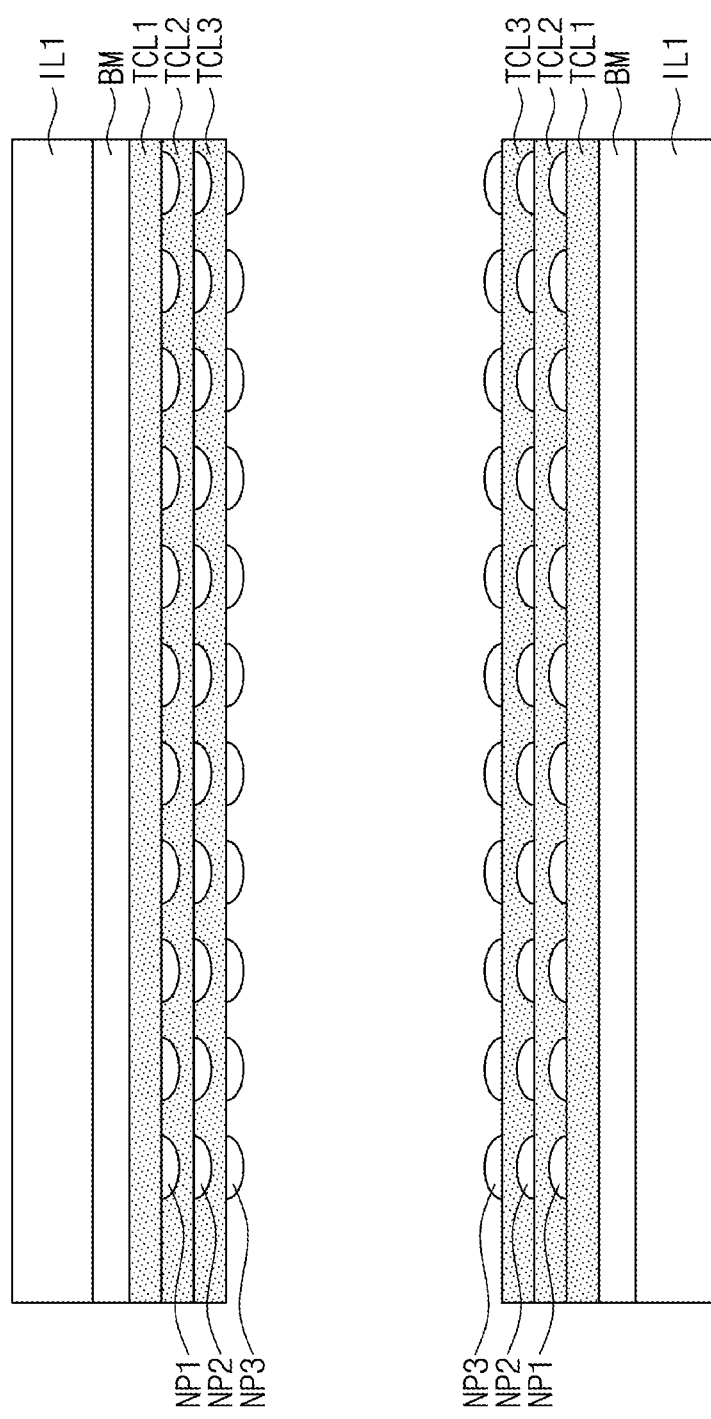

Referring to FIGS. 18 and 23, first to third amorphous layers TCL1, TCL2, and TCL3 and first to third nano dot patterns NP1, NP2, and NP3 may be formed on the electrode insulating layer BM. The first amorphous layer TCL1 may be formed on the electrode insulating layer BM, the first nano dot pattern NP1 may be formed on the first amorphous layer TCL1, and the second amorphous layer TCL2 may be formed on the first amorphous layer TCL1 to cover the first nano dot pattern NP1. The second nano dot pattern NP2 may be formed on the second amorphous layer TCL2, and the third amorphous layer TCL3 may be formed on the second amorphous layer TCL2 to cover the second nano dot pattern NP2. The third nano dot pattern NP3 may be provided on the third amorphous layer TCL3. The first to third amorphous layers TCL1, TCL2, and TCL3 may be formed of or include tungsten nitride.

Figure 24:
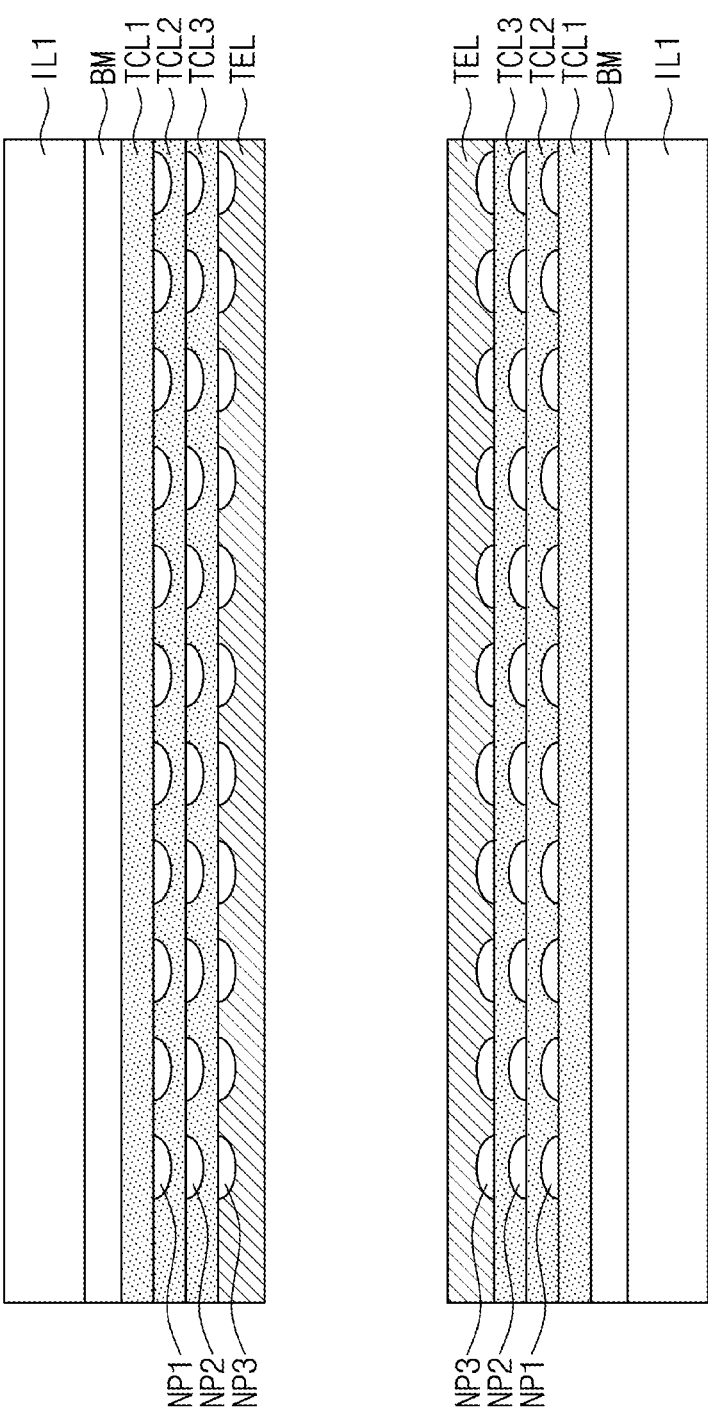

Referring to FIGS. 19 and 24, the conductive layer TEL may be formed on the third amorphous layer TCL3 provided with the third nano dot pattern NP3. The conductive layer TEL may be provided on the third amorphous layer TCL3 to cover the third nano dot pattern NP3.

Figure 25:
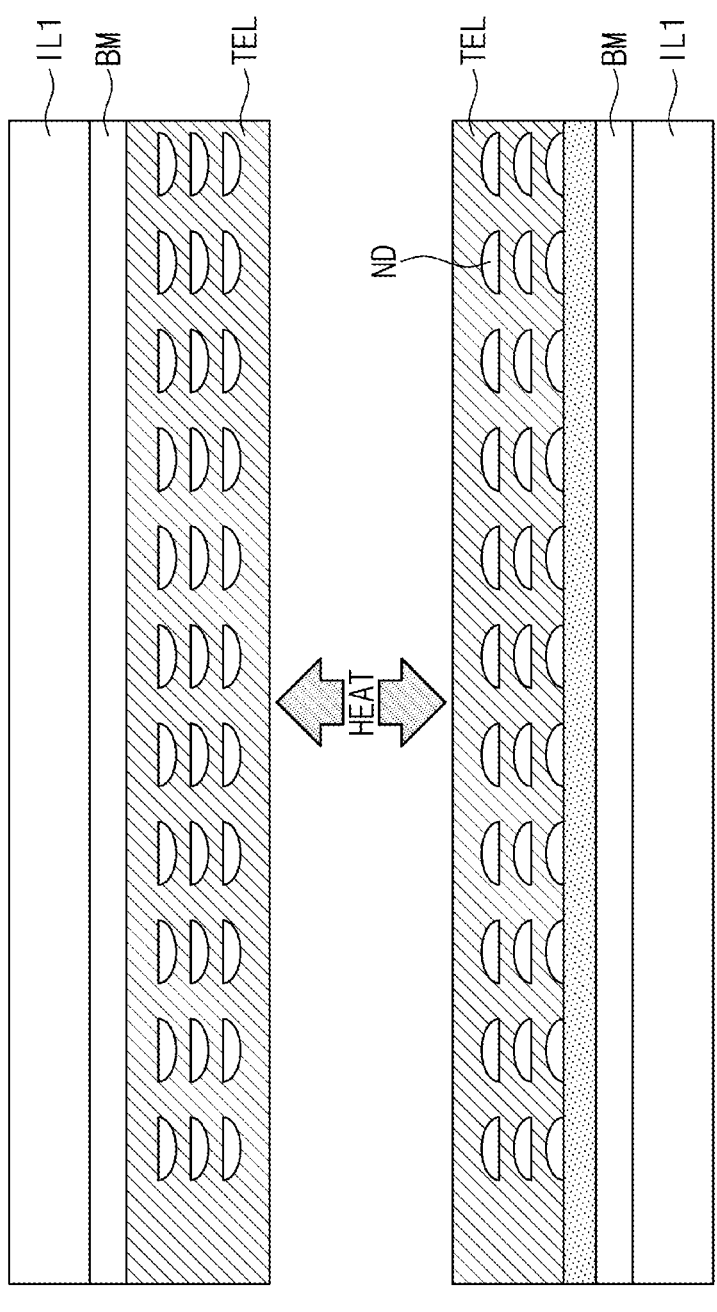

Referring to FIGS. 20 and 25, heat may be applied to the conductive layer TEL. As a result, a nitrogen content in each of the first to third amorphous layers TCL1, TCL2, and TCL3 may be lowered, and thus, the first to third amorphous layers TCL1, TCL2, and TCL3 may have substantially the same physical or chemical structure as the conductive layer TEL.

Figure 26:
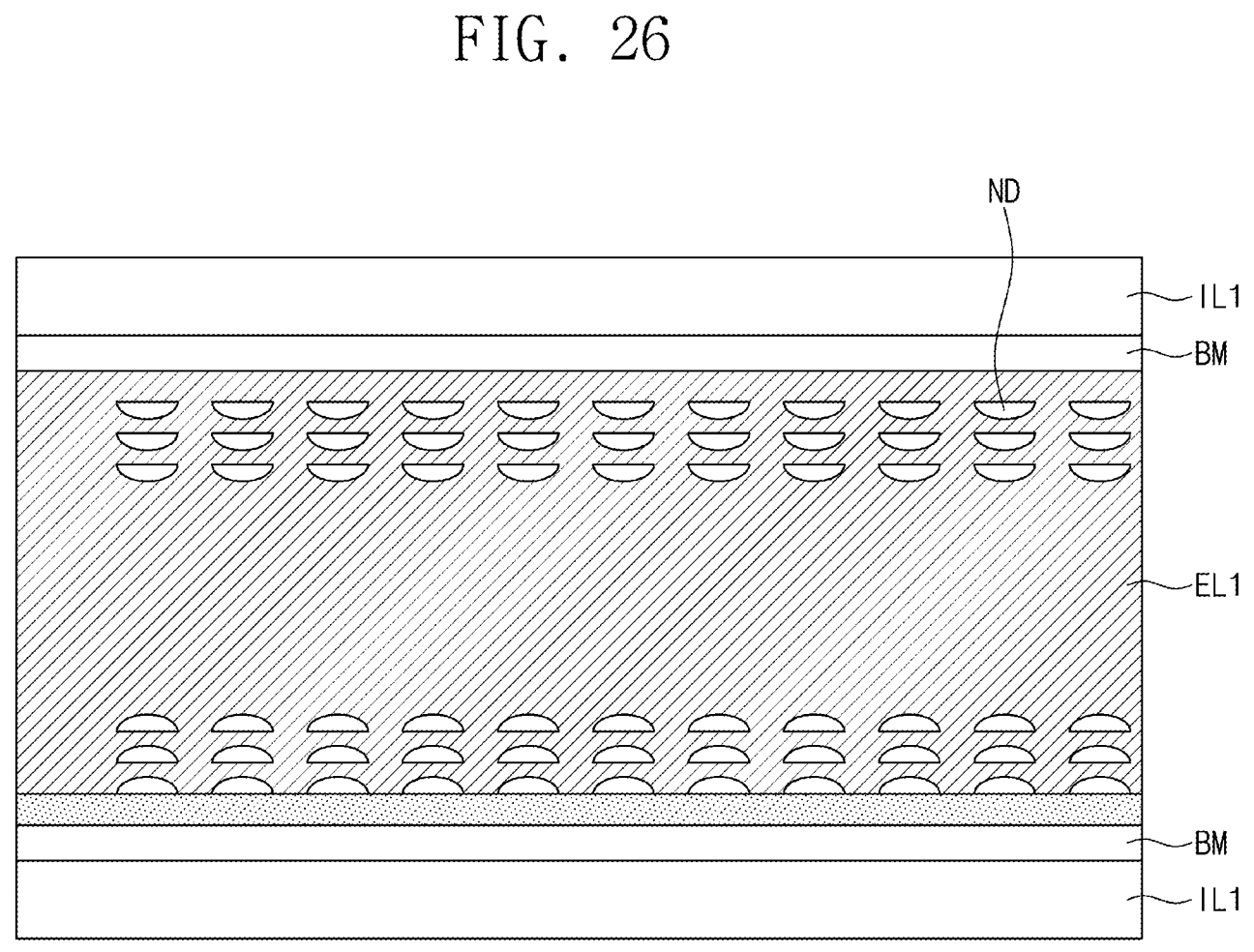

Referring to FIGS. 21 and 26, a conductive material may be formed to fill an empty space enclosed by the conductive layer TEL. Accordingly, the nano dot pattern NDP in the first electrode EL1 may be formed to have a multi-layered structure.

By way of summation and review, an example embodiment provides a three-dimensional semiconductor memory device with improved reliability. An example embodiment also provides a method of fabricating a three-dimensional semiconductor memory device with improved reliability.

That is, according to an embodiment, nano dot patterns may be provided in electrodes of a semiconductor device at predetermined distances from barrier metals of the electrodes. In this case, even when heat is applied to the electrodes, it may be possible to prevent a data storing layer or an insulating layer in a vertical channel structure, which is provided adjacent to the electrodes, from being damaged and thereby to improve reliability of the semiconductor device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An electrode structure, comprising:
a conductive electrode, the conductive electrode including a first surface;
an insulating layer on the conductive electrode, the insulating layer being in contact with the first surface of the conductive electrode; and
a nano dot pattern in the conductive electrode and spaced apart from the first surface of the conductive electrode, the nano dot pattern including nano dots arranged in parallel to the first surface of the conductive electrode, and each of the nano dots including:
a first side surface adjacent to the first surface of the conductive electrode, the first side surface being flat and parallel to the first surface of the conductive electrode, and
a second side surface opposite to the first side surface, the second side surface being convex in a direction away from the first surface of the conductive electrode,
wherein the conductive electrode includes a conductive material, and the nano dot pattern is in the conductive material,
wherein the conductive electrode includes tungsten.

2. The electrode structure as claimed in claim 1, wherein the first side surface of each of the nano dots is aligned with an adjacent first side surface in a straight line.

3. The electrode structure as claimed in claim 1, wherein each of the nano dots includes TiN.

4. The electrode structure as claimed in claim 1, wherein the nano dot pattern includes a first pattern and a second pattern, the first pattern being spaced apart from the first surface of the conductive electrode by a first distance, and the second pattern being spaced apart from the first pattern by a second distance.

5. The electrode structure as claimed in claim 4, wherein the nano dots of the first pattern have the same shape as the nano dots of the second pattern.

6. The electrode structure as claimed in claim 4, wherein a distance between the nano dots of the first pattern is smaller than a distance between the nano dots of the second pattern.

7. The electrode structure as claimed in claim 1, wherein:
the conductive electrode includes a second surface opposite to the first surface, and
the nano dot pattern includes a first pattern and a second pattern, the first pattern being spaced apart from the first surface by a first distance, and the second pattern being spaced apart from the second surface by a second distance.

8. The electrode structure as claimed in claim 7, wherein the first distance is equal to the second distance.

9. The electrode structure as claimed in claim 1, wherein a largest thickness of the nano dots is 2 angstroms to 10 angstroms.

10. The electrode structure as claimed in claim 1, wherein a distance between the nano dot pattern and the first surface of the conductive electrode is 5 angstroms to 15 angstroms.

11. A semiconductor device, comprising:
a substrate;
a cell array structure on the substrate, the cell array structure including a plurality of electrodes and a plurality of insulating layers which are alternately stacked;
a vertical channel structure penetrating the plurality of electrodes; and
a nano dot pattern in a first electrode of the plurality of electrodes, the nano dot pattern including a first pattern parallel to a bottom surface of the first electrode, a second pattern parallel to a side surface of the first electrode, and a third pattern parallel to a top surface of the first electrode, and each of the first pattern, the second pattern, and the third pattern including nano dots,
wherein the side surface of the first electrode is parallel to a side surface of the vertical channel structure,
wherein the nano dots of the first pattern are spaced apart from the bottom surface of the first electrode and are arranged parallel to the bottom surface of the first electrode,
wherein the nano dots of the second pattern are spaced apart from the side surface of the first electrode and are arranged parallel to the side surface of the first electrode, and
wherein the nano dots of the third pattern are spaced apart from the top surface of the first electrode and are arranged parallel to the top surface of the first electrode.

12. The semiconductor device as claimed in claim 11, wherein the first electrode includes tungsten, and the nano dots include TiN.

13. The semiconductor device as claimed in claim 11, wherein:
each of the nano dots of the second pattern includes a first surface adjacent to the side surface of the first electrode and a second surface opposite to the first surface,
the first surface is flat and parallel to the side surface of the first electrode, and
the second surface is convex in a direction away from the first surface.

14. The semiconductor device as claimed in claim 11, wherein the vertical channel structure includes a vertical insulating pattern, a vertical semiconductor pattern, and a gapfill insulating pattern.

15. The semiconductor device as claimed in claim 11, wherein:
the first pattern is spaced apart from the bottom surface of the first electrode by a first distance,
the second pattern is spaced apart from the side surface of the first electrode by a second distance, and
the third pattern is spaced apart from the top surface of the first electrode by a third distance, the first distance being substantially equal to the third distance.

16. The semiconductor device as claimed in claim 15, wherein the second distance is larger than or equal to the first distance.

17. The semiconductor device as claimed in claim 11, wherein:
the nano dot pattern further includes a fourth pattern, a fifth pattern, and a sixth pattern, the nano dots of the fourth pattern are spaced apart from the first pattern and are arranged parallel to the bottom surface of the first electrode, the nano dots of the fifth pattern are spaced apart from the second pattern and are arranged parallel to the side surface of the first electrode, and the nano dots of the sixth pattern are spaced apart from the third pattern and are arranged parallel to the top surface of the first electrode.

18. An electronic system, comprising:

a three-dimensional semiconductor memory device; and a controller electrically connected to the three-dimensional semiconductor memory device, the controller being configured to control the three-dimensional semiconductor memory device, wherein the three-dimensional semiconductor memory device includes:

a substrate, a cell array structure on the substrate, the cell array structure including a plurality of electrodes and a plurality of insulating layers which are alternately stacked, a vertical channel structure penetrating the plurality of electrodes, and a nano dot pattern in a first electrode of the plurality of electrodes, the nano dot pattern including a first pattern parallel to a bottom surface of the first electrode, a second pattern parallel to a side surface of the first electrode, and a third pattern parallel to a top surface of the first electrode, and each of the first pattern, the second pattern, and the third pattern including nano dots, wherein the side surface of the first electrode is parallel to a side surface of the vertical channel structure, wherein the nano dots of the first pattern are spaced apart from the bottom surface of the first electrode and are arranged parallel to the bottom surface of the first electrode, wherein the nano dots of the second pattern are spaced apart from the side surface of the first electrode and are arranged parallel to the side surface of the first electrode, and wherein the nano dots of the third pattern are spaced apart from the top surface of the first electrode and are arranged parallel to the top surface of the first electrode.

19. The electronic system as claimed in claim 18, wherein the first electrode includes tungsten, and the nano dots include TiN.

\* \* \* \* \*